(12) United States Patent
Schneider

(10) Patent No.: US 7,750,826 B2
(45) Date of Patent: Jul. 6, 2010

(54) DATA STRUCTURE MANAGEMENT FOR LOSSLESS DATA COMPRESSION

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 28 days.

(21) Appl. No.: 12/324,771

(22) Filed: Nov. 26, 2008

(65) Prior Publication Data

US 2010/0127901 A1 May 27, 2010

(51) Int. Cl.
*H03M 7/34* (2006.01)
*H03M 7/38* (2006.01)
(52) U.S. Cl. ............................ 341/51; 341/87; 341/106
(58) Field of Classification Search .................. 341/51, 341/87, 106
See application file for complete search history.

(56) References Cited

U.S. PATENT DOCUMENTS

| 4,464,650 | A |   | 8/1984  | Eastman et al. |          |
|-----------|---|---|---------|----------------|----------|
| 4,558,302 | A |   | 12/1985 | Welch          |          |
| 4,814,746 | A |   | 3/1989  | Miller et al.  |          |
| 5,151,697 | A | * | 9/1992  | Bunton         | 341/51   |
| 5,572,206 | A | * | 11/1996 | Miller et al.  | 341/51   |
| 5,951,623 | A | * | 9/1999  | Reynar et al.  | 341/51   |
| 6,606,040 | B2| * | 8/2003  | Abdat          | 341/87   |

OTHER PUBLICATIONS

Jacob Ziv et al., "A Universal Algorithm for Sequential Data Compression", IEEE Transactions on Information Theory, May 1977, pp. 337-343, vol. IT-23, No. 3, Ronneby, Sweden.
Jacob Ziv et al., "Compression of Individual Sequences via Variable-Rate Coding", IEEE Transactions on Information Theory, Sep. 1978, pp. 530-536, vol. IT-24, No. 5.

* cited by examiner

*Primary Examiner*—Khai M Nguyen
(74) *Attorney, Agent, or Firm*—Blakely, Sokoloff, Taylor & Zafman LLP

(57) ABSTRACT

An input stream of characters is received. A new string entry is added to a data structure based on a current portion of the input stream if the current portion fails to match any of a plurality of existing string entries in the data structure. An additional string entry is added to the data structure based on a combination of the current portion and a previous portion of the input stream, wherein the additional string entry corresponds to a subset of the combination that fails to match any of the plurality of existing string entries in the data structure. An output stream is generated that includes literal values of the characters and index values corresponding to string entries in the data structure that match portions of the input stream.

21 Claims, 9 Drawing Sheets

DATA STRUCTURE MANAGEMENT FOR LOSSLESS DATA COMPRESSION

RELATED PATENTS

The present patent application is related to co-pending patent application Ser. No. 12/324,784, entitled "Lossless Data Compression With Separated Index Values and Literal Values in Output Stream," filed on Nov. 26, 2008.

TECHNICAL FIELD

Embodiments of the present invention relate to data compression, and more specifically to improvements to compression techniques used in the LZ78 and LZW compression algorithms.

BACKGROUND

To efficiently store data and/or transfer data between networked computing devices, data compression algorithms are often used. Two common lossless compression algorithms include Lempel-Ziv 78 (LZ78) and Lempel-Ziv-Welch (LZW). Both the LZ78 compression algorithm and the LZW compression algorithm are dictionary coders that use previously received characters in an input stream to encode subsequent characters in the input stream.

The LZ78 algorithm starts with an empty table of a fixed size (e.g., capable of holding 4096 string entries). As new characters and strings are encountered in the input stream, new string entries are added to the table, each string entry having a unique index value. When those same characters and/or strings are encountered later in the input stream, the characters/strings are replaced with the index value for a matching string entry. In LZ78, since the table has a fixed size, the index values also have a fixed size. For example, if the table has a fixed size of 4096 entries, each index value is 12 bits in length, regardless of the number of entries currently in the table. In LZ78, once the table fills up, all entries in the table are deleted. String entries can then continue to be added to the table until it again fills up. This process introduces an inefficiency, in that the table needs to be rebuilt from scratch each time it becomes full.

The LZW algorithm starts with a table that is preconfigured with a separate string entry for each American Standard Code for Information Interchange (ASCII) character (256 string entries). In the LZW algorithm, as new strings are encountered in the input stream, the size of the table grows, and new string entries are added to the table, each string entry having a unique index value. When those same characters and/or strings are encountered later in the input stream, the characters/strings are replaced with the index value for a matching string entry. As the size of the table grows, the number of bits needed to uniquely represent an index value increases. Once the table grows to a predetermined size (e.g., 65,535 string entries), the string entries in the table are deleted, and the table starts over at its preconfigured size with its preconfigured string entries. As in the LZ78 algorithm, this process introduces an inefficiency, in that the table needs to be rebuilt from scratch each time it becomes full. In LZW, since the table has a preconfigured initial size, the index values have a minimum size of 8 bits.

Both the LZ78 and the LZW algorithms generate an output stream that consists of alternating index values and literal values of characters from the input stream. An example output stream would have an index value, a literal value, an index value, a literal value, etc. in sequential order. This makes it difficult to apply additional compression techniques to the output stream to further compress it, or to perform other post processing of the output stream.

BRIEF DESCRIPTION OF THE DRAWINGS

The present invention is illustrated by way of example, and not by way of limitation, in the figures of the accompanying drawings and in which.

DETAILED DESCRIPTION

Figure 1:
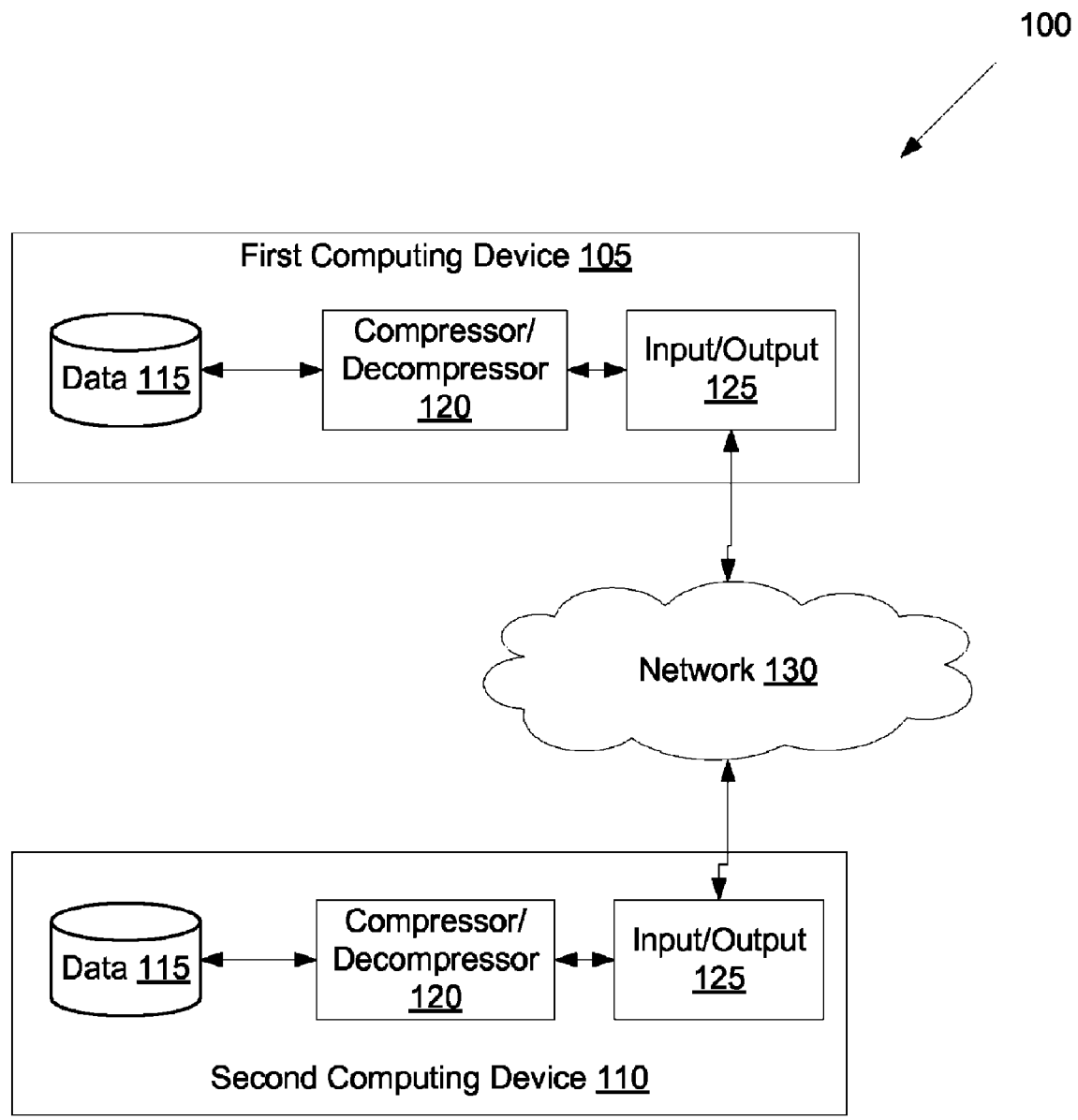
FIG. 1 illustrates an exemplary network architecture in which embodiments of the present invention may operate.

Described herein is a method and apparatus for compressing data using an efficient lossless compression technique. In one embodiment, an input stream of characters is received, and a data structure is initialized. A new string entry is added to the data structure based on a current portion of the input stream if the current portion fails to match any existing string entries in the data structure. An additional string entry is added to the data structure based on a combination of the current portion and a previous portion of the input stream. The additional string entry corresponds to a subset of the combination that fails to match any of the plurality of existing string entries in the data structure. The data structure may then be reordered and/or string entries may be removed from the data structure. An output stream is generated that includes literal values of the characters and index values corresponding to string entries in the data structure that match portions of the input stream.

In the following description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed description which follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing", "computing", "receiving", "parsing", "generating", "compressing", or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes a machine readable storage medium (e.g., read only memory ("ROM"), random access memory ("RAM"), magnetic disk storage media, optical storage media, flash memory devices, etc.), a machine readable transmission medium (electrical, optical, acoustical or other form of propagated signals (e.g., carrier waves, infrared signals, digital signals, etc.)), etc.

FIG. 1 illustrates an exemplary network architecture 100 in which embodiments of the present invention may operate. The network architecture 100 may include a first computing device 105 and a second computing device 110 connected via a network 130. The network may be a public network (e.g., the internet) or a private network (e.g., a local area network (LAN), intranet, intraweb, etc.).

Each of the first computing device 105 and second computing device 110 may be a desktop computer, notebook computer, cellular phone, personal digital assistant (PDA), or other device capable of processing machine-executable code. Moreover, the first computing device 105 and second computing device 110 may each operate as a client or server in a client-server environment, or as a peer in a peer-to-peer environment. In one embodiment, the first computing device 105 and second computing device 110 each include data 115, a compressor/decompressor 120, and an input/output unit 125.

Data 115 may be data of arbitrary size, and may be stored in a storage medium such as a hard disk drive, random access memory (RAM), read only memory (ROM), optical media, magnetic media, etc. Compressor/decompressor 120 may be connected with a storage medium that includes data 115. Compressor/decompressor 120 may compactly encode data for transmission or storage, and decode received or read data. Encoded data may be transmitted and received via network 130 using input/output 125, with which compressor/decompressor 120 is connected. For example, first computing device 105 and second computing device 110 may be components of a distributed computing system. To transmit messages from first computing device 105 to second computing device 110, first computing device 105 may compress the message (including any message payload such as attached files), and send the compressed message to second computing device 110. Second computing device 110 may then decompress the message, and then process or store the decompressed message.

Figure 2:
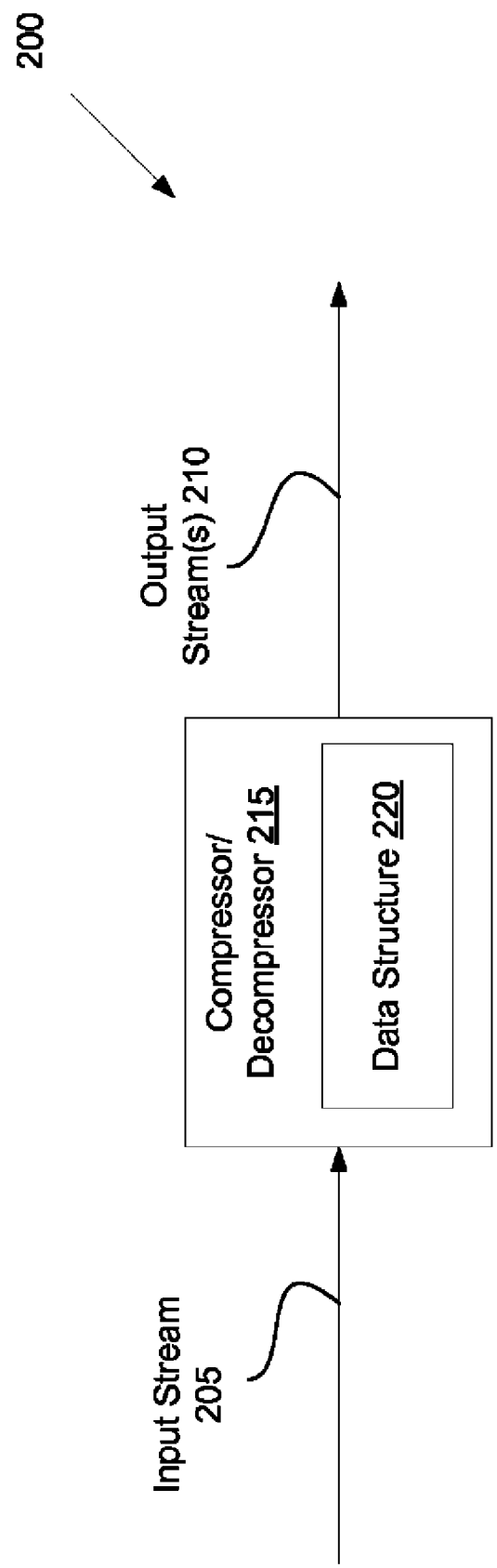
FIG. 2 illustrates a block diagram of a compressor/decompressor, in accordance with one embodiment of the present invention.

FIG. 2 illustrates a block diagram of a compressor/decompressor 215, in accordance with one embodiment of the present invention. In one embodiment, compressor/decompressor 215 corresponds to compressor/decompressor 120 of FIG. 1. The compressor/decompressor 215 receives one or more input streams 205, compresses the input streams 205, and generates one or more output streams 210. The input stream 205 may be, for example, a text file, image file, executable file, document file, spreadsheet file, etc. The input stream 205 may include an uncompressed file that is to be compressed or a compressed file that is to be decompressed. If the input stream 205 includes an uncompressed file, then the output stream 210 includes a compressed version of the file. If the input stream 205 includes a compressed file, then the output stream 210 includes an uncompressed version of the file. An uncompressed file includes a sequence of characters, each of which may be represented as a byte (8 bit binary sequence), hereinafter referred to as a literal value of the character. A compressed file includes a combination of literal values and index values (explained below).

As the input stream 205 is compressed or decompressed, a data structure 220 is generated and updated. The data structure 220 may be a table, list, tree, or other arrangement of data. In one embodiment, the data structure is a B-tree. A B-tree is a tree data structure that keeps data sorted and allows searches, insertions and deletions in logarithmic amortized time. Use of a B-tree enables the data structure 220 to be quickly reordered and pruned, as described in greater detail below. In another embodiment, the data structure is a large dynamic table as described in copending U.S. patent application Ser. No. 12/130,872, entitled "Management of Large Dynamic Tabes." As new characters and/or sequences of characters (referred to herein as strings) are encountered in the input stream 205, string entries matching those characters and/or strings are added to the data structure 220. In one embodiment, the data structure 220 is a dictionary that associates each string entry with a unique index value. The data structure 220 is used to substitute strings of characters with index values to compress the input stream 205, or to substitute index values with strings of characters to decompress the input stream 205.

Figure 3A:
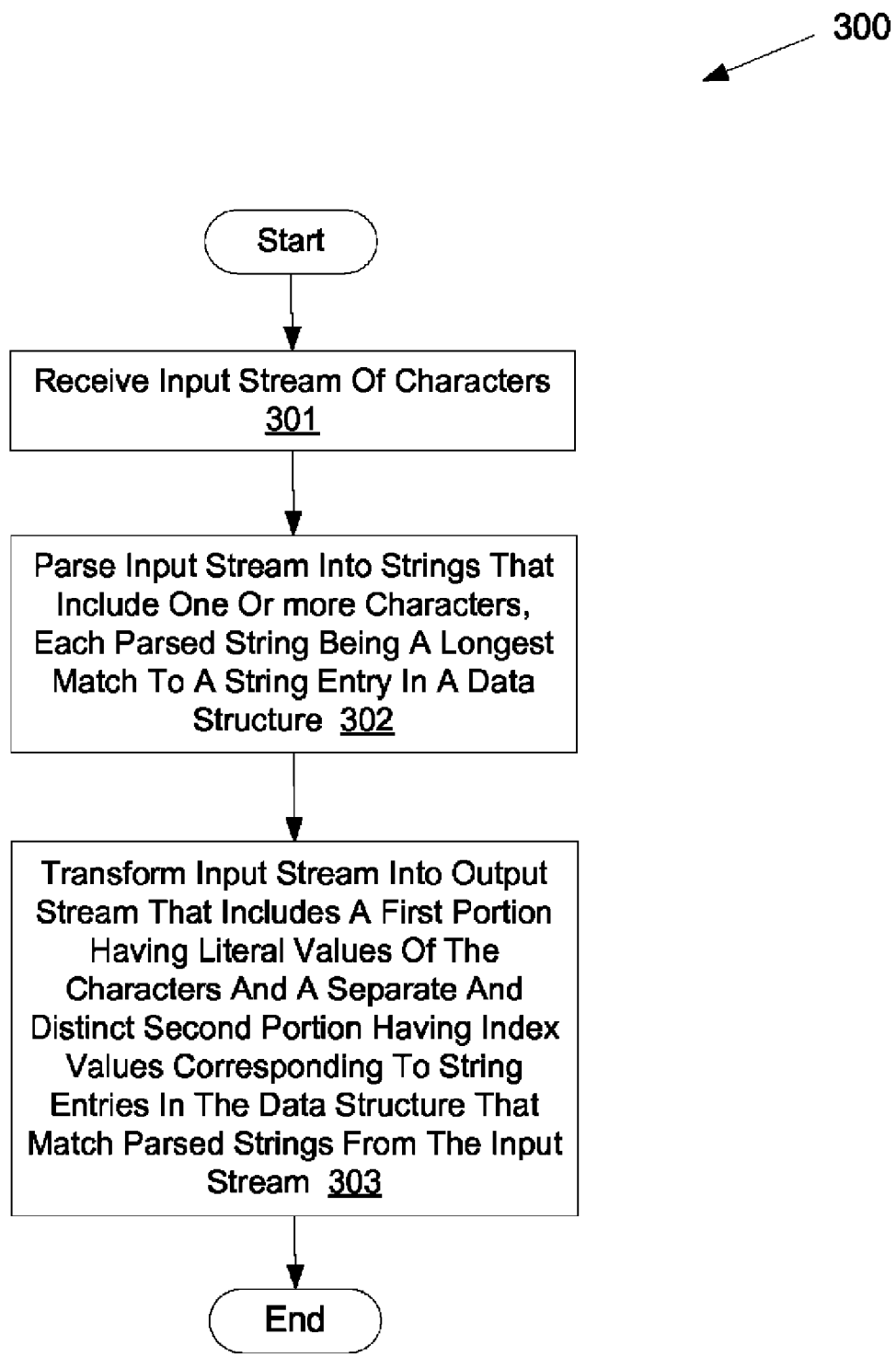
FIG. 3A illustrates a flow diagram of one embodiment for a method of compressing data.

FIG. 3A illustrates a flow diagram of one embodiment for a method 300 of compressing data. The method may be performed by processing logic that may comprise hardware (e.g., circuitry, dedicated logic, programmable logic, microcode, etc.), software (such as instructions run on a processing device), or a combination thereof. In one embodiment, method 300 is performed by compressor/decompressor 215 of FIG. 2.

Referring to FIG. 3A, at block 301 an input stream of characters is received. The input stream may be binary encoded, with each character represented as a byte. At block 302, the input stream is parsed into multiple strings, each of which includes one or more characters. Each parsed string is the longest match to a string entry in a data structure.

At block 303, an output stream is generated. The generated output stream includes a first portion having literal values of the characters from the input stream and a separate and distinct second portion having index values corresponding to string entries that match parsed strings from the input stream. In one embodiment, the first portion is appended to one end of the second portion in the output stream. Alternatively, the output stream may be divided into two separate output streams. A first output stream may include the first portion (e.g., the literal values), and a second output stream may include the second portion (e.g., the index values). Generating multiple distinct output streams, each having different types of data (e.g., one including index values and another including literal values), can improve the effectiveness of post processing techniques.

Figure 3B:
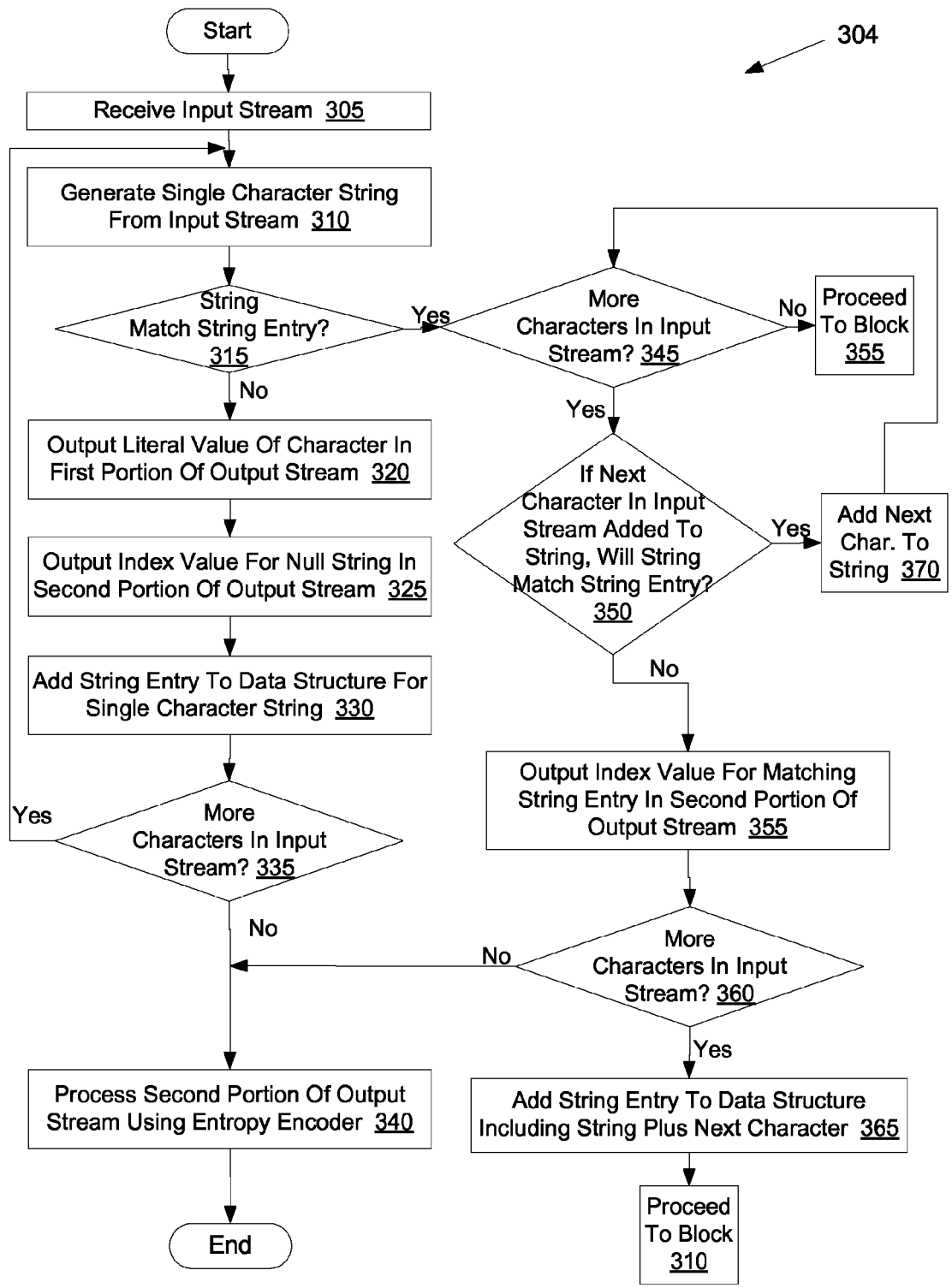
FIG. 3B illustrates a flow diagram of another embodiment for a method of compressing data.

FIG. 3B illustrates a flow diagram of another embodiment for a method 304 of compressing data. The method may be performed by processing logic that may comprise hardware (e.g., circuitry, dedicated logic, programmable logic, microcode, etc.), software (such as instructions run on a processing device), or a combination thereof. In one embodiment, method 304 is performed by compressor/decompressor 215 of FIG. 2.

Referring to FIG. 3B, at block 305 an input stream is received by a compressor. Upon receiving the input stream, the compressor initializes a data structure for storing string entries. In one embodiment, the initialized data structure is preconfigured to be an empty data structure that includes only an entry for the null string. Alternatively, the data structure may be preconfigured with multiple string entries (e.g., it may be preconfigured with a string entry for each ASCII character). In one embodiment, the data structure is a variable size data structure. Index values that are used to specify string entries for a variable size data structure include enough bits to assign a unique index value to each string entry. For example, if the data structure includes 2 string entries one bit is used, for 2-4 entries two bits are used, for 5-8 entries three bits are used, and so on. Using a variable size data structure can improve a compression ratio (ratio of a size of the input stream to the size of the output stream) of the compressor.

At block 310, the compressor generates a single character string from the input data. For example, if the input stream is the word ABRACADABRA, then the compressor may generate a single character string with the letter A.

At block 315, the compressor determines whether the single character string matches a string entry in the data structure. If the single character string does match a string entry in the data structure, the method proceeds to block 345. If the single character string does not match a string entry in the data structure, the method proceeds to block 320.

At block 320, the compressor outputs a literal value of the character in a first portion of an output stream. For example, if the single character string includes the letter "A", then the compressor outputs the letter A (e.g., the ASCII code for the letter A). At block 325, the compressor outputs an index value for the null string in a second portion of the output stream. By separating the output stream into the first portion and the second portion, an intermingling of the index values and the literal values in the output stream is reduced or eliminated. Therefore, instead of having alternating index values and literal values in the output stream (e.g., where output stream appears as a code, a literal, a code, a literal, and so on), as in LZW and LZ78, the output stream includes back to back codes and back to back literals (e.g., where the output stream appears as code, code, code, followed by literal, literal, literal). This can increase the effectiveness of post-processing the output stream (e.g., by an entropy encoder).

In one embodiment, the first portion is appended to one end of the second portion. In a further embodiment, the order of the literal values in the first portion is reversed, and the first portion is appended to an end of the second portion. In another embodiment, the first portion and the second portion are included in separate output streams. For example, the first portion may be included in a literals output stream (an output stream including only literal values), and the second portion may be included in a code output stream (an output stream including only index values).

At block 330, a string entry is added to the data structure for the single character string. The new string entry is assigned a unique index value. For example, if the new string entry for the string "A" were added to a data structure that included a string entry for the null string with an index value of 0, then the new string entry would have an index value of 1.

At block 335, the compressor determines whether there are any additional characters in the input stream. If additional characters are detected, the method returns to block 310. If no additional characters are detected, the method proceeds to block 340. Alternatively, if there are no more characters, the method may end.

Similar to block 335, at block 345 the compressor determines whether there are additional characters in the input stream. If there are additional characters in the input stream, the method proceeds to block 350. Otherwise, the method proceeds to block 355.

At block 350, the compressor checks whether an updated string would match a string entry if a next character in the input stream was added to the string. If, after adding the next character from the input stream to the string, the string matches a string entry, the method proceeds to block 370, the next character is added to the string, and the method returns to block 345. Otherwise, the method proceeds to block 355.

At block 355, an index value for the string entry that matches the string is output in the second portion of the output stream. At block 360, the compressor again determines whether there are any additional characters in the input stream. If additional characters are present, the method proceeds to block 365. If no additional characters are present, the method proceeds to block 340.

At block 365, a new string entry is added to the data structure including the matched string plus the next character in the input stream. For example, if the matched string was a string including the second A in ABRACADABRA, then the new string entry would consist of the characters "AC." The method then proceeds to block 310.

At block 340, the compressor processes the second portion of the output stream using an entropy encoder. The entropy encoder replaces fixed size bits of an input with variable size bits in an output. In an entropy encoder, more common bit sequences get replaced with shorter bit streams, and less common bit sequences get replaced with longer bit streams. The entropy encoder may operate on a whole number of bits (e.g., as performed in Huffman coding), or may operate on a fractional number of bits (e.g., as performed in range coding).

Compression performed by the entropy encoder may be improved by reordering the data structure as new string entries are added and/or as matches are made between strings of the input stream and string entries. Compression can be improved by reordering the string entries such that those string entries that frequently match strings from portions of the input stream are assigned low index values and string entries that infrequently match strings from portions of the input stream are assigned high index values. Such a rearrangement compresses the range of index values that are output in the second output stream, and thus improves the efficiency of the entropy encoder.

The method then ends.

Method 304 shows one example of data structure maintenance rules (e.g., rules for adding string entries to the data structure). However, other data structure maintenance rules may also be used, some examples of which are described below. For example, data structure maintenance rules may include rules for reordering the data structure, removing entries from the data structure, etc.

The following example (Example A), described with reference to Tables A1-A9 below, shows one embodiment of compressing data. Example A illustrates compression of the word abracadabra with a compressor that uses variable index value sizes (based on the number of string entries in a string table) and an initial string table that has a string entry for the null string at index value 0. For example A, the following rules are used for adding string entries to the string table: 1) a string entry is added for a literal the first time that literal is encountered, and 2) any time a non-literal string that already has an entry in the data structure is encoded and is followed by another string, a new string is added to the data structure that is a concatenation of the two strings. Note that encountering a literal may add two string entries to the data structure (e.g., when "c" is encountered in abra[c]adabra). For the word abracadabra, the coding and string table evolves as follows:

The initial table only contains the empty (null) string:

TABLE A1

| Index | 0 |
|---|---|
| String | "" |

At [a]bracadabra, the only string entry that matches is the index 0 string "". Note that brackets surrounding a letter of the stream "abracadabra" identify which character of the input stream is the current character. In one embodiment, since "" is the only string in the table, it doesn't need to be explicitly added to the code stream (stream that includes index values). The literal value for the "a" character is added to the literal stream, which is now "a". The code stream is empty. The string "a" is added to the table at this point:

TABLE A2

| Index | 0 | 1 |
|---|---|---|
| String | "" | "a" |

At a[b]racadabra, again the only string that matches is the index 0 string "". Since there is more than one entry in the table, the code for "" must be explicit. Using a minimal bit encoding, this could be encoded in a single 0 bit. The literals stream contains "ab", and the string "b" gets added to the table. The previously used string was "" (the implicit index used when coding the first "a"), so the concatenated string would also be "b":

TABLE A3

| Index | 0 | 1 | 2 |
|---|---|---|---|
| String | "" | "a" | "b" |

At ab[r]acadabra, again the only string that matches is the index 0 string "". This would be coded as the two bits 00 since there are now three possible string entries, resulting in a code stream (in bits) of 000, and a literal stream of "abr". The table would be updated to:

TABLE A4

| | Index | | | |
|---|---|---|---|---|
| | 0 | 1 | 2 | 3 |
| String | "" | "a" | "b" | "r" |

At abr[a]cadabra, we have a match at index 1 ("a"). This would be coded as the two bits 01, resulting in a code stream (in bits) of 00001. The literal stream is unchanged at "abr". The table would stay the same.

At abra[c]adabra, we again can only match at "". This would be coded as the two bits 00, resulting in a code stream of 0000100. The "c" gets appended to the literal stream, which is now "abrc". However, since the last code we used was not for "", we add two strings to the table at this point—one for "c", and one for "ac":

TABLE A5

| | Index | | | | | |
|---|---|---|---|---|---|---|
| | 0 | 1 | 2 | 3 | 4 | 5 |
| String | "" | "a" | "b" | "r" | "c" | "ac" |

At abrac[a]dabra, we have a match at index 1 ("a"). This would be coded as the three bits 001, resulting in a code stream of 00001000 01. The literal stream is unchanged at "abrc", as is the string table. In one embodiment, since there are more than 8 bits in the code stream, the compressor emits the first byte of the code stream at this point, which would be 08 hex (the hexadecimal equivalent of 00001000).

At abraca[d]abra, we again only match at "". This would be coded as three bits 000, so the code stream would be the byte 08, with the additional bits 01000. The "d" would be added to the literal stream, which becomes "abrcd". Since the previous code was "a", both "d" and "ad" are added to the table:

TABLE A6

| | Index | | | | | | | |
|---|---|---|---|---|---|---|---|---|
| | 0 | 1 | 2 | 3 | 4 | 5 | 6 | 7 |
| String | "" | "a" | "b" | "r" | "c" | "ac" | "d" | "ad" |

At abracad[a]bra, we have a match at index 1 ("a"). This would be coded as the three bits 001, making the code stream the two bytes 08 41 (since 41 is the hexadecimal equivalent of 01000001). The literals stream and the table are both unchanged.

At abracada[b]ra, we have a match at index 2. This would be coded with the three bits 010, making the code stream the two bytes 08 41, plus the three bits 010. Further, the string "ab" would be added to the table:

TABLE A7

| | Index | | | | | | | | |
|---|---|---|---|---|---|---|---|---|---|
| | 0 | 1 | 2 | 3 | 4 | 5 | 6 | 7 | 8 |
| String | "" | "a" | "b" | "r" | "c" | "ac" | "d" | "ad" | "ab" |

At abracadab[r]a, we have a match at index 3, which requires four bits to code, giving us the code stream 08 41, plus the seven bits 010-0011. The literals stream stays "abrcd", and the "br" string gets added to the table:

TABLE A8

| | Index | | | | | | | | | |
|---|---|---|---|---|---|---|---|---|---|---|
| | 0 | 1 | 2 | 3 | 4 | 5 | 6 | 7 | 8 | 9 |
| String | "" | "a" | "b" | "r" | "c" | "ac" | "d" | "ad" | "ab" | "br" |

At abracadabr[a], we have a match at index 1, which requires four bits to code, giving us the code stream 08 41 46 (since 46 is the hexadecimal equivalent of 01000110), plus the three bits 001. The literals stream stays "abrcd", and the "ra" string gets added to the table:

TABLE A9

| Index | 0 | 1 | 2 | 3 | 4 | 5 | 6 | 7 | 8 | 9 | 10 |
|---|---|---|---|---|---|---|---|---|---|---|---|
| String | "" | "a" | "b" | "r" | "c" | "ac" | "d" | "ad" | "ab" | "br" | "ra" |

At this point, we're at the end of the input stream. In one embodiment, this can be indicated in one of two ways: by coding a value past the end of the table, or by coding the "" string without adding a literal to the literals stream. Adding four zero bits, plus one more to bring the output stream to an even byte gives a final code stream of 08 41 46 20 and a final literals stream of "abrcd". Just reversing the literals and sticking them on the end of the code stream yields a uniquely decodable encoding of the string "abracadabra" in 9 bytes. The literals could actually be coded in 36 bits as 01100001 10100000 00000011 11000000 0000, for a total compressed length of 67 bits, but this would still require 9 bytes, if an integral number of bytes were required.

Another example (example B), described below with reference to tables B1-B9, shows another embodiment of compressing data. In example B the string table is updated as if the literal value was coded as a single character string. The rules for adding string entries to the table of example A are used, with the modification that any string followed by another string results in a new string added to the table. Hence, when "b" in a[b]racadabra is encountered, the strings "b" and "ab" get added to the table.

Starting with a single entry table, coding the first "a" character would emit no bits to the code stream, add "a" to the literals stream, and add the "a" entry to the table. This would give us the table:

TABLE B1

| Index | 0 | 1 |
|---|---|---|
| String | "" | "a" |

At a[b]racadabra, the only string that matches is the index 0 string "". The code for the "" entry (a single zero bit) gets added to the code stream, and the "b" gets added to the literal stream, making it "ab". We add "b" to the table, since we added a literal. We also add "ab" to the table. This gives us:

TABLE B2

| Index | 0 | 1 | 2 | 3 |
|---|---|---|---|---|
| String | "" | "a" | "b" | "ab" |

At ab[r]acadabra, the only string that matches is again "", which now requires two bits to code, making the code stream the bits 000. The literals stream becomes "abr", and the strings "r" and "br" get added to the table:

TABLE B3

| Index | 0 | 1 | 2 | 3 | 4 | 5 |
|---|---|---|---|---|---|---|
| String | "" | "a" | "b" | "ab" | "r" | "br" |

At abr[a]cadabra, there is a match at "a" (index 1), so the code stream is updated with the three bit index value to 000001. The literal stream is unchanged, but "ra" gets added to the table:

TABLE B4

| Index | 0 | 1 | 2 | 3 | 4 | 5 | 6 |
|---|---|---|---|---|---|---|---|
| String | "" | "a" | "b" | "ab" | "r" | "br" | "ra" |

At abra[c]adabra, the only match is again "", so three bits of zero get added to the code stream, and "c" gets added to the literals stream. The code stream is now the byte 04, plus the bit 0. The literals stream is now "abrc". Both "c" and "ac" get added to the table:

TABLE B5

| Index | 0 | 1 | 2 | 3 | 4 | 5 | 6 | 7 | 8 |
|---|---|---|---|---|---|---|---|---|---|
| String | "" | "a" | "b" | "ab" | "r" | "br" | "ra" | "c" | "ac" |

At abrac[a]dabra, the match is "a" at index 1, which takes four bits to encode, making the code stream the byte 04, plus the five bits 00001. The string "ca" gets added to the table:

TABLE B6

| Index | 0 | 1 | 2 | 3 | 4 | 5 | 6 | 7 | 8 | 9 |
|---|---|---|---|---|---|---|---|---|---|---|
| String | "" | "a" | "b" | "ab" | "r" | "br" | "ra" | "c" | "ac" | "ca" |

At abraca[d]abra, the only match is again "", so we add four bits of zero to the code stream, and "d" to the literals stream, resulting in a code stream with the two bytes 04 08, plus the bit 0, and a literals stream of "abrcd". Both "d" and "ad" get added to the table:

TABLE B7

| Index | 0 | 1 | 2 | 3 | 4 | 5 | 6 | 7 | 8 | 9 | 10 | 11 |
|---|---|---|---|---|---|---|---|---|---|---|---|---|
| String | "" | "a" | "b" | "ab" | "r" | "br" | "ra" | "c" | "ac" | "ca" | "d" | "ad" |

At abracad[a]bra, a match is found at index 3 ("ab"), so a four bit 3 value is added to the code stream, which is now the two bytes 04 08, and the five bits 00011. The literals stream is unchanged. The table gets an entry for "dab":

TABLE B8

| | | | | | | Index | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 |
| String | "" | "a" | "b" | "ab" | "r" | "br" | "ra" | "c" | "ac" | "ca" | "d" | "ad" | "dab" |

At abracadab[r]a, a match is found at index 6. The code stream is updated to the three bytes 04 08 1b, and the bit 0. The string "abra" gets added to the table:

TABLE B9

| | | | | | | Index | | | | | | | | |
|---|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| String | "" | "a" | "b" | "ab" | "r" | "br" | "ra" | "c" | "ac" | "ca" | "d" | "ad" | "dab" | "abra" |

Adding the code for the "" entry, the code stream becomes the three bytes 04 08 1b, and the five bits 00000. Using minimal coding for the literals, this takes 65 bits. If we assume that a decoder will stop when it can no longer construct a code, we can drop the final four bits, making this 61 bits. Keeping the final coding of "", and padding to a byte boundary, we get the code stream 04 08 1b 00.

Figure 3C:
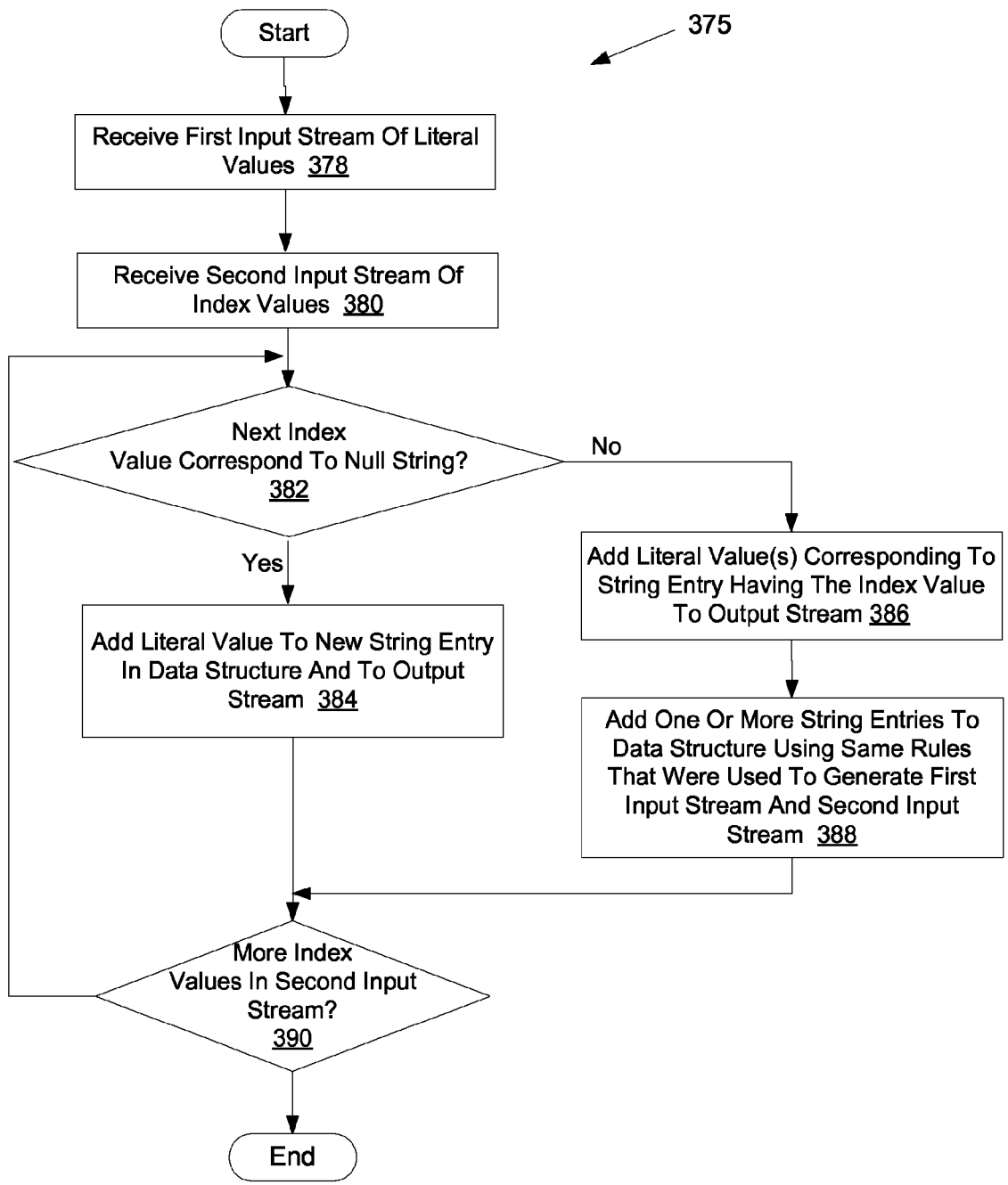
FIG. 3C illustrates a flow diagram of one embodiment for a method of decompressing data.

Methods 300 and 304, as described with reference to FIGS. 3A and 3B above, are both methods of compressing data. FIG. 3C illustrates a flow diagram of one embodiment for a method 375 of decompressing data. Method 375 can be performed to decompress data that has been compressed using method 300 and/or method 304. Method 375 may be performed by processing logic that may comprise hardware (e.g., circuitry, dedicated logic, programmable logic, microcode, etc.), software (such as instructions run on a processing device), or a combination thereof. In one embodiment, method 375 is performed by compressor/decompressor 215 of FIG. 2.

Referring to FIG. 3C, at block 378 a first input stream of literal values is received by a decompressor. At block 380, a second input stream of index values is received. The first input stream and the second input stream correspond to compressed data. Upon receiving the input streams, the decompressor may initialize a data structure. The initialized data structure corresponds to a data structure that was initialized when the data was compressed. For example, if a data structure including only the null string was initialized when the data was compressed, then a data structure including only the null string is also initialized before decompressing the data.

At block 382, the decompressor determines whether a next index value (or first index value if there have been no previous index values) corresponds to the null string. If the next index value corresponds to the null string, the method proceeds to block 384. If the next index value does not correspond to the null string, the method proceeds to b lock 386.

At block 384, a new string entry is added to the data structure for the literal value. The literal value is also added to the output stream. The method then proceeds to block 390.

At block 386, the compressor adds literal values corresponding to a string entry associated with the index value to the output stream. For example, if the index value was 4, and it corresponded to the string entry "ABCD", then the literal values for A, B, C and D would be added to the output stream. The method continues to block 388.

At block 388, one or more string entries are added to the data structure using the same rules that were used to compress the data (e.g., to generate the first and second input streams). For example, if the rules of adding string entries of method 304 were used to compress the data (as identified, for example, in blocks 330 and 355), then those same rules may be used to add string entries to the data structure during decompression. It is important that the same rules for managing the data structure be used for both compression and decompression to ensure that decompressed data exactly matches the data before it was compressed.

At block 390, the decompressor determines whether there are any more index values in the second input stream. If there are additional index values, then the method returns to block 382. Otherwise, the data has been completely decompressed, and the method ends.

Method 375 has been described using a first input stream and a second input stream. However, method 375 may also be used to decompress a single input stream that includes a first portion having literal values and a second distinct portion having index values.

The following example (example C), described with reference to Tables C1-C10, shows one embodiment of decompressing data. As described in method 375, decoding requires building a data structure from the incoming index values and literal values. Using our example code stream 04 08 1b 00 and literal stream abrcd that were generated in example B, and table maintenance rules used in example B, decoding would proceed as follows:

Start with a single-entry table:

TABLE C1

| | Index |
|---|---|
| | 0 |
| String | "" |

In one embodiment, since the only string in the table is "", the decoder knows that's the only possible string (so, no bits of the code stream are consumed). The string "" indicates that a literal should be output, so the first literal from the literal stream is consumed. The decoder also adds a string consisting of that literal to the table. The output is now "a", the code stream is unchanged, and the remaining literal stream is brcd. The table becomes:

TABLE C2

|        | Index |     |
|--------|-------|-----|
|        | 0     | 1   |
| String | ""    | "a" |

At this point, since there are multiple possible strings, the decoder starts consuming the code stream. At this iteration, the codes are 1 bit long. Expressing the first byte of the code stream as bits, we have 00000100. The decoder uses the first bit (which is zero) to construct the index of the next string. The index value (0) corresponds to the string "", so another literal is consumed from the literals stream. The consumed literal ("b") is appended to the output, which is now "ab". The unconsumed literal stream is now rcd, and the unconsumed code stream is the seven bits 0000100, and the three bytes 08 1b 00. The table is updated with a string for the newly recovered literal and the concatenation of the prior string and the literal (that would be the strings "b" and "ab"):

TABLE C3

|        | Index |     |     |      |
|--------|-------|-----|-----|------|
|        | 0     | 1   | 2   | 3    |
| String | ""    | "a" | "b" | "ab" |

At this point, the decoder needs to consume two bits from the input stream. These two bits correspond to an index of 0, for "". This causes the coder to consume the next literal and append it to the output, which is now "abr". The unconsumed literals are now cd, and the unconsumed code stream is the five bits 00100, and the three bytes 08 1b 00. The table is updated with "r" and "br":

TABLE C4

|        | Index |     |     |      |     |      |
|--------|-------|-----|-----|------|-----|------|
|        | 0     | 1   | 2   | 3    | 4   | 5    |
| String | ""    | "a" | "b" | "ab" | "r" | "br" |

The decoder now consumes three bits from the code stream (001), obtaining the index for the string "a", which is added to the output stream (output stream is now "abra"). The literals stream is still cd, and the unconsumed code stream is the two bits 00, plus the three bytes 08 1b 00. The table is updated with "ra":

TABLE C5

|        | Index |     |     |      |     |      |      |
|--------|-------|-----|-----|------|-----|------|------|
|        | 0     | 1   | 2   | 3    | 4   | 5    | 6    |
| String | ""    | "a" | "b" | "ab" | "r" | "br" | "ra" |

The decoder is still consuming 3 bits at a time from the code stream, so it consumes the two bits left from the first byte, plus the high-order bit from the next byte, to construct the index value zero, which is the string "". This signals to the decoder that it needs to consume the next unconsumed literal from the literal stream ("c"), append it to the output stream (which is now "abrac"), and add the entries "c" and "ac" to the table. The unconsumed literals stream is now d, and the unconsumed code stream is the seven bits 0001000, plus the two bytes 1b 00. The table is now:

TABLE C6

|        | Index |     |     |      |     |      |      |     |      |
|--------|-------|-----|-----|------|-----|------|------|-----|------|
|        | 0     | 1   | 2   | 3    | 4   | 5    | 6    | 7   | 8    |
| String | ""    | "a" | "b" | "ab" | "r" | "br" | "ra" | "c" | "ac" |

Since there are now more than 8 entries in the table, the decoder starts consuming 4 bits at a time from the code stream. The next four bits are 0001, which indexes the "a" string. The decoder appends the string "a" to the output ("abraca"), and adds the string "ca." to the table. The unconsumed literals stream is still d, and the unconsumed code stream is the three bits 000, plus the two bytes 1b 00. The table is now:

TABLE C7

|        | Index |     |     |      |     |      |      |     |      |      |
|--------|-------|-----|-----|------|-----|------|------|-----|------|------|
|        | 0     | 1   | 2   | 3    | 4   | 5    | 6    | 7   | 8    | 9    |
| String | ""    | "a" | "b" | "ab" | "r" | "br" | "ra" | "c" | "ac" | "ca" |

The decoder consumes the three bits left over from the second code stream byte, plus the high order bit from the third code stream byte (1b), to construct the index 0, "". This causes the decoder to consume the next unconsumed literal ("d"), add it to the output ("abracad"), and add the entries "d" and "ad" to the table. The literals stream is now completely consumed, and the unconsumed code stream is the seven bits 0011011, plus the byte 00. The table is updated to:

TABLE C8

|        | Index |     |     |      |     |      |      |     |      |      |     |      |
|--------|-------|-----|-----|------|-----|------|------|-----|------|------|-----|------|
|        | 0     | 1   | 2   | 3    | 4   | 5    | 6    | 7   | 8    | 9    | 10  | 11   |
| String | ""    | "a" | "b" | "ab" | "r" | "br" | "ra" | "c" | "ac" | "ca" | "d" | "ad" |

The decoder is still consuming four bits at a time, so it constructs an index of 3 ("ab") from the next four bits of the code stream. It adds the string "ab" to the end of the output, which is now "abracadab". The code stream is now the three bits 011, plus the byte 00. The table is updated with the entry "dab" to:

TABLE C9

| | | | | | | | Index | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 |
| String | "" | "a" | "b" | "ab" | "r" | "br" | "ra" | "c" | "ac" | "ca" | "d" | "ad" | "dab" |

The decoder grabs the remaining three bits from the third code stream byte, plus the high order bit of the fourth code stream byte, to construct 0110, or 6. This corresponds to the string "ra", which is appended to the output to form "abracadabra". The remaining code stream is the 7 bits 0000000, and the table is updated with the string "abra" to:

TABLE C10

| | | | | | | | Index | | | | | | | |
|---|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| String | "" | "a" | "b" | "ab" | "r" | "br" | "ra" | "c" | "ac" | "ca" | "d" | "ad" | "dab" | "abra" |

The decoder grabs the next four bits, which gives it an index of zero, or the string "". Since there are no more unconsumed literals, the decoder knows it has reached the end. The decompressed data "abracadabra" matches the starting data that was compressed in example B.

Figure 4A:
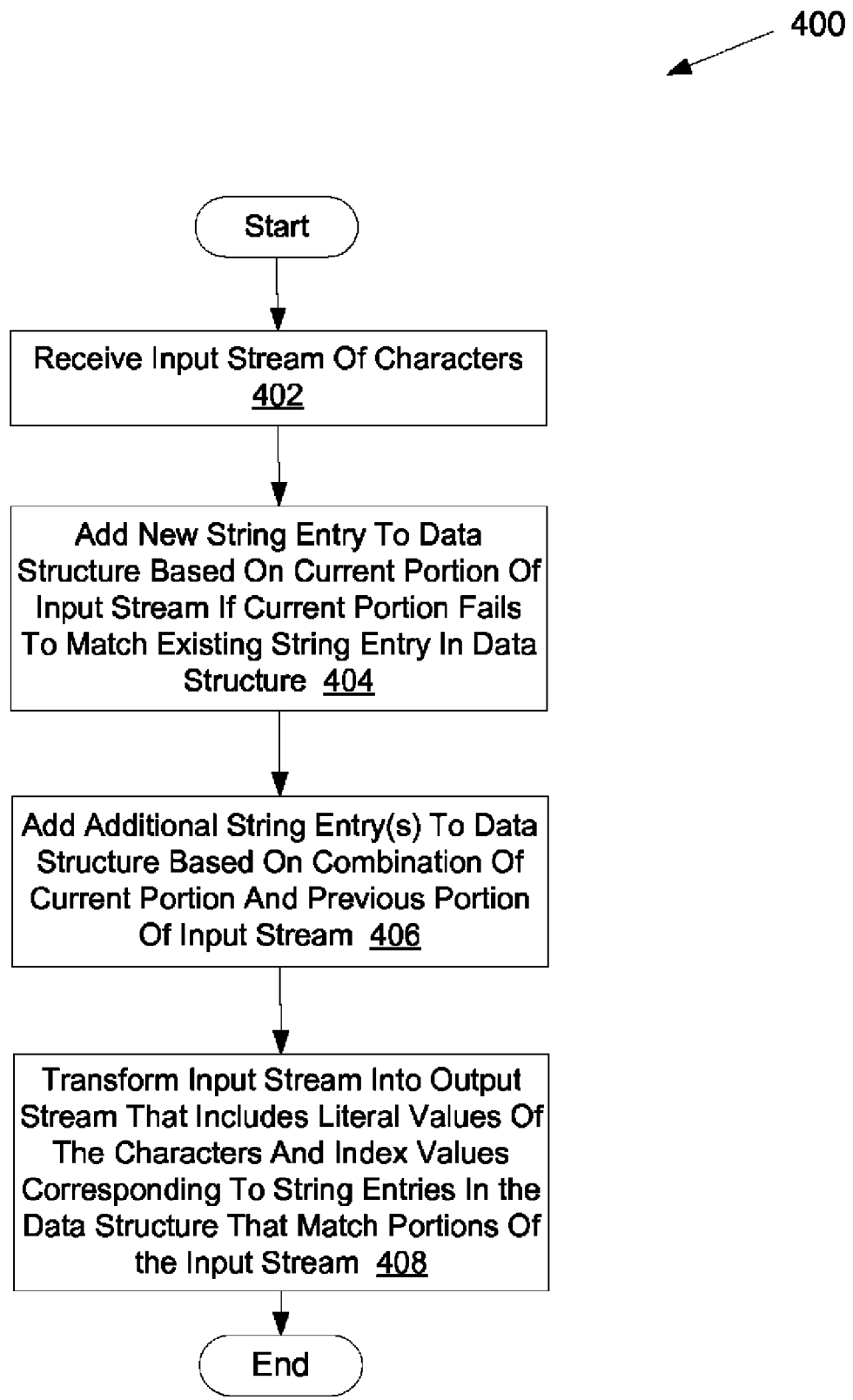
FIG. 4A illustrates a flow diagram of yet another embodiment for a method of compressing data.

FIG. 4A illustrates a flow diagram of yet another embodiment for a method 400 of compressing data. The method may be performed by processing logic that may comprise hardware (e.g., circuitry, dedicated logic, programmable logic, microcode, etc.), software (such as instructions run on a processing device), or a combination thereof. In one embodiment, method 400 is performed by compressor/decompressor 215 of FIG. 2.

Referring to FIG. 4A, at block 402 an input stream of characters is received. The input stream can be parsed into multiple portions of variable size based on matches to string entries in a data structure. At block 404 a new string entry is added to a data structure based on a current portion of the input stream if the current portion fails to match an existing string entry in the data structure.

At block 406, an additional string entry is added to the data structure based on a combination of the current portion of the data stream and a previous portion of the data stream. In some instances, multiple string entries are added to the data structure, each string entry including a different combination of the current portion and the previous portion of the input stream. For example, if the previous portion of the input stream was "ACE" and the current portion of the input stream is "BAR," then one or more of the following string entries may be added to the data structure: ACEBAR, ACEB, ACEBA, CEBAR, CEBA, CEB, EBAR, EBA, EB. By adding the additional string entries to the data structure at block 406, the sequences of characters in the string entries do not have to appear in the input stream multiple times before being added to the data structure. Therefore, matches to longer string entries can be made sooner in the data stream. New string entries are added to the data structure only if they do not match existing string entries in the data structure.

At block 408, an output stream is generated that includes literal values of the characters from the input stream and index values corresponding to string entries in the data structure that match portions of the input stream. The method then ends.

Figure 4B:
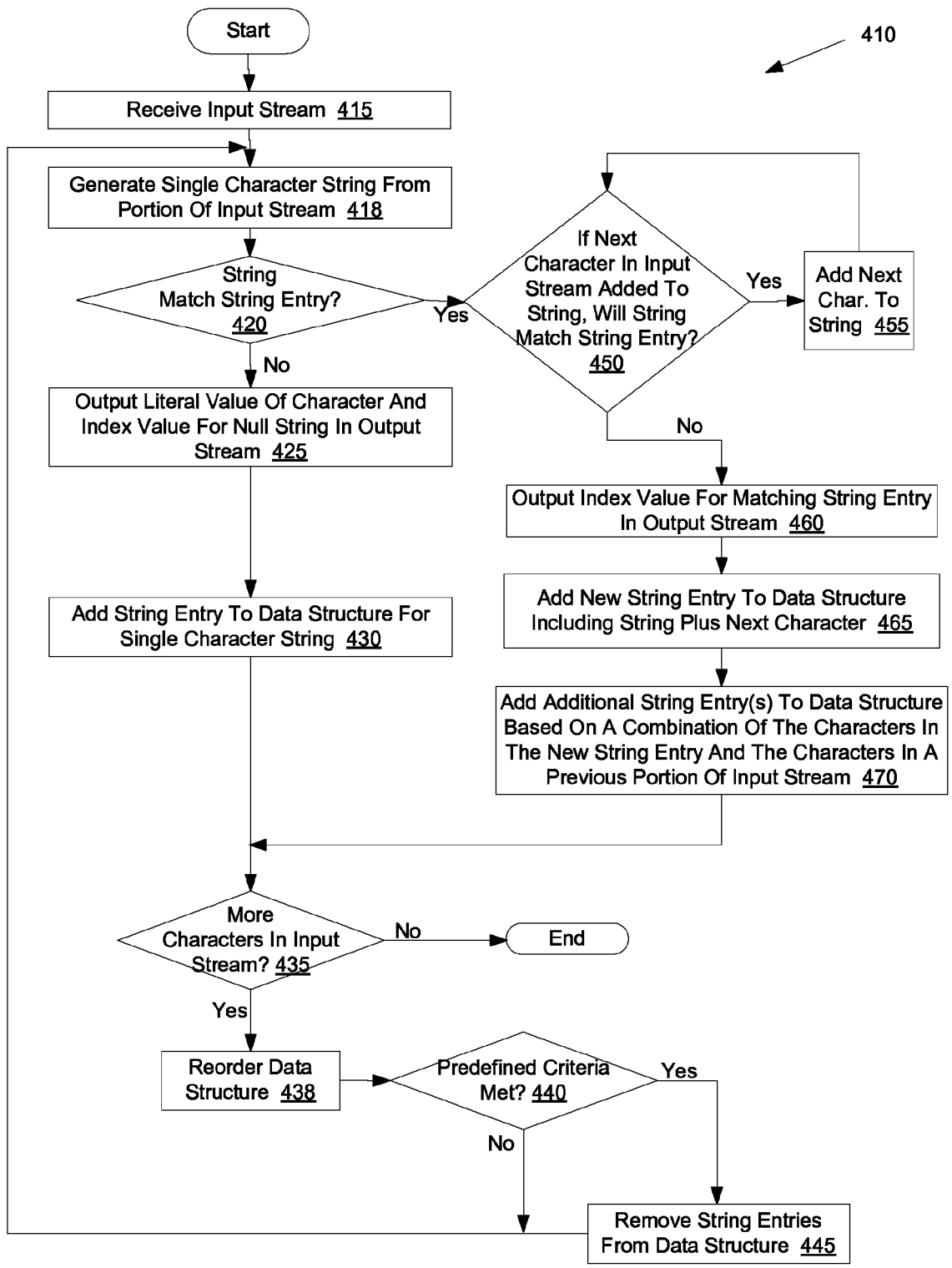
FIG. 4B illustrates a flow diagram of still yet another embodiment for a method of compressing data.

FIG. 4B illustrates a flow diagram of still yet another embodiment for a method 410 of compressing data. The method may be performed by processing logic that may comprise hardware (e.g., circuitry, dedicated logic, programmable logic, microcode, etc.), software (such as instructions run on a processing device), or a combination thereof. In one embodiment, method 410 is performed by compressor/decompressor 215 of FIG. 2.

Referring to FIG. 4B, at block 415 an input stream is received by a compressor. Upon receiving the input stream, the compressor initializes a data structure for storing string entries. At block 418, the compressor generates a single character string from the input data. At block 420, the compressor determines whether the single character string matches a string entry in the data structure. If the single character string does match a string entry in the data structure, the method proceeds to block 450. If the single character string does not match a string entry in the data structure, the method proceeds to block 425.

At block 425, the compressor outputs a literal value of the character and an index value for the null string in an output stream. At block 430, a new string entry is added to the data structure for the single character string. The new string entry is assigned a unique index value. The method then continues to block 435.

At block 450, the compressor checks whether an updated string would match a string entry if a next character in the input stream was added to the string. If, after adding the next character from the input stream to the string, the string matches a string entry, the method proceeds to block 455, the next character is added to the string, and the method returns to block 450. Otherwise, the method proceeds to block 460.

At block 460, an index value for the string entry that matches the string is output in the output stream. At block 465, a new string entry is added to the data structure including the matched string plus the next character in the input stream. For example, if the matched string was a string including the second A in ABRACADABRA, then the new string entry would be the string "AC."

At block 470, one or more additional string entries are added to the data structure based on a combination of the characters in the new string entry and the characters in a previous portion of the input stream. For example, if the new string entry was "BAR" and the previous portion of the input stream is "ACE," then one or more of the following string entries may be added to the data structure: ACEBAR, ACEB, ACEBA, CEBAR, CEBA, CEB, EBAR, EBA, EB. New string entries are added to the data structure only if they do not match existing string entries in the data structure.

Adding additional string entries to the data structure can cause the data structure to rapidly grow in size. For example, the growth rate may be bounded above by $n^2$, where n is the number of bytes seen so far. In one embodiment, to slow the data structure's rate of expansion, additional string entries are not added at block 470 if they include more than a predefined threshold number of characters. For example, if the threshold is set to 4 characters, then additional string entries that would be added to the data structure in the previous example would include: ACEB, CEBA, CEB, EBAR, EBA and EB. If you limit the length of the added string entries to some value k, the growth rate is bounded by kn. In another embodiment, there is an upper limit to the number of additional entries that can be added at a time. For example, each time the operations at block 470 are performed, no more than 1, 2, 5, etc. additional string entries may be added to the data structure. The method then proceeds to block 435.

At block 435, the compressor determines whether there are any additional characters in the input stream. If additional characters are detected, the method continues to block 438. If no additional characters are detected, the method ends.

At block 438, the compressor reorders the data structure. Reordering the data structure enables the data structure to be pruned (reduced in size without deleting all of the entries in the data structure). Reordering also reduces the index values of string entries that frequently match portions of the input stream. In one embodiment, string entries are reordered in the data structure such that those string entries that frequently match strings from portions of the input stream are assigned low index values and string entries that infrequently match strings from portions of the input stream are assigned high index values. In one embodiment, a count is maintained of the number of times that each string entry matches a string in the input stream. Those string entries with higher counts may be assigned low index values, while those string entries with lower counts may be assigned high index values. In another embodiment, each time a match is made to a string entry, that string entry is moved to the top of the data structure (e.g., such that the string entry has an index value of zero), and all other string entries are shifted down one or more places (e.g., a string entry that previously had an index value of 1 could subsequently have an index value of 2). Other reordering schemes may also be used.

At block 440, the compressor determines whether a predefined criterion or criteria for deleting string entries from the data structure has been met. Examples of predefined criteria include a size threshold for the data structure, a time interval, etc. If the predefined criteria are met, the method proceeds to block 445. If no predefined criteria are met, the method returns to block 418.

At block 445, one or more string entries are removed from the data structure. In one embodiment, string entries having the highest index values are removed. For example, if 1000 of 5000 entries are to be removed, then entries 4001-5000 would be removed, while entries 1-4000 would not be removed. In one embodiment, the last half, last ¾, last ⅚, etc. of the data structure may be removed. Alternatively, all string entries that have matched fewer than a predetermined number of strings from the input stream are removed (e.g., string entries that have a match count of 0 may be removed). In one embodiment, to prevent deleting the null string, the null string is fixed at index value 0 in the data structure. Therefore, during reordering, the null string would never be reordered. Alternatively, if the null string is deleted, the null string may be added back to the data structure (e.g., by replacing the new last entry in the data structure with the null string).

The reordering of the data structure enables the data structure to be intelligently pruned such that those string entries that frequently match portions of the input stream remain in the data structure, and those string entries that infrequently match portions of the input stream or that have never matched portions of the input stream are removed. Such selective pruning of the data structure keeps the data structure at a reasonably small size without removing useful string entries. This can significantly improve the compression ratio for the compressor.

Reordering the data structure also causes smaller index values to be used in general, and compresses a range of index values used. For example, in a table with 5000 entries, only 100 of those entries may be used in an output stream, and 15 of those entries may account for a significant portion of the output stream. By processing such an output stream of index values with an entropy encoder, further compression may be achieved.

The following example (example D), described with reference to tables D1-D5, shows another embodiment of compressing data. Example D illustrates how additional string entries may be added to a data structure during compression based on current and previous portions of the input stream.

Starting with the empty table (table that includes only the null string), the first letter of [a]bracadabra causes the coder to add "a" to the literals stream, and the string "a" to the table. At a[b]racadabra, a zero code gets added to the code stream, "b" gets added to the literal stream, and "b" and "ab" get added to the table. The code stream is 0, and the literals stream is "ab".

At ab[r]acadabra, the code 0 gets generated, and "r" gets added to the literal stream (making the code stream 0, 0, and the literal stream "abr"). In addition to "r" and "br", the coder adds "abr" to the table. The new table will look like:

TABLE D1

| | Index | | | | | | |
|---|---|---|---|---|---|---|---|
| | 0 | 1 | 2 | 3 | 4 | 5 | 6 |
| String | "" | "a" | "b" | "ab" | "r" | "br" | "abr" |

At abr[a]cadabra, the coder can find a match at index 1, so the code stream becomes 0, 0, 1. The strings "ra," "abra" and "bra" would be added to the table at this point. The resulting table would read as follows:

TABLE D2

| | Index | | | | | | | | | |
|---|---|---|---|---|---|---|---|---|---|---|
| | 0 | 1 | 2 | 3 | 4 | 5 | 6 | 7 | 8 | 9 |
| String | "" | "a" | "b" | "ab" | "r" | "br" | "abr" | "ra" | "bra" | "abra" |

Continuing to abra[c]adabra, the index for "" is generated (making the code stream 0, 0, 1, 0), and "c" gets added to the literals stream (making it "abrc"). In addition to "c" and "ac", the coder also adds "rac", "brac", and "abrac" to the table:

TABLE D3

| | Index | | | | | | | | | | | | | | |
|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 |
| String | "" | "a" | "b" | "ab" | "r" | "br" | "abr" | "ra" | "bra" | "abra" | "c" | "ac" | "rac" | "brac" | "abrac" |

At abrac[a]dabra, the coder once again generates the code for "a" (making the code stream 0, 0, 1, 0, 1). The strings "ca", "aca", "raca", "braca", and "abraca" are all added to the table:

TABLE D4

| | Index | | | | | | | | | |
|---|---|---|---|---|---|---|---|---|---|---|
| | 0 | 1 | 2 | 3 | 4 | 5 | 6 | 7 | 8 | 9 |
| String | "" | "a" | "b" | "ab" | "r" | "br" | "abr" | "ra" | "bra" | "abra" |
| | Index | | | | | | | | | |
| | 10 | 11 | 12 | 13 | 14 | 15 | 16 | 17 | 18 | 19 |
| String | "c" | "ac" | "rac" | "brac" | "abrac" | "ca" | "aca" | "raca" | "braca" | "abraca" |

At abraca[d]abra, the coder generates the code for "" (code stream is now 0, 0, 1, 0, 1, 0), adds "d" to the literal stream (which is now "abrcd"), and adds the strings "d", "ad", "cad", "acad", "racad", "bracad", and "abracad" to the table:

TABLE D5

| | Index | | | | | | | | | |
|---|---|---|---|---|---|---|---|---|---|---|
| | 0 | 1 | 2 | 3 | 4 | 5 | 6 | 7 | 8 | 9 |
| String | "" | "a" | "b" | "ab" | "r" | "br" | "abr" | "ra" | "bra" | "abra" |
| | Index | | | | | | | | | |
| | 10 | 11 | 12 | 13 | 14 | 15 | 16 | 17 | 18 | 19 |
| String | "c" | "ac" | "rac" | "brac" | "abrac" | "ca" | "aca" | "raca" | "braca" | "abraca" |
| | Index | | | | | | | | | |
| | 20 | 21 | 22 | 23 | 24 | 25 | 26 | | | |
| String | "d" | "ad" | "cad" | "acad" | "racad" | "bracad" | "abracad" | | | |

At abracad[a]bra, the coder finds "abra" at index 9, making the code stream 0, 0, 1, 0, 1, 0, 9. The coder would add the strings "dabra", "adabra", "cadabra", "acadabra", "racadabra", "bracadabra", and "abracadabra" to the table (not illustrated). At the end of the input, the coder would add 0 to the code stream, and nothing to the literals stream, to indicate that it's done.

Using minimal bit encodings, the code stream values would take 1, 2, 3, 4, 4, 5, 5, and 6 bits, respectively, for a total of 30 bits—the total size, including compressed literals would be 66 bits in this case. Decoding would reconstruct the tables in the same order as the coding example. Note that the codes 0, 0, 1, 0, 1, 0, 9 correspond to (implied "")-""-""-"a"-""-"a"-""-"abra". Filling in the blanks with the literals stream ("abrcd") gives "a"-"b"-"r"-"a"-"c"-"a"-"d"-"abra".

The following example (example E), described with reference to tables E1-E7, shows another embodiment of compressing data. In example E, a string table is reordered using a move-to-front ordering technique. In the move-to-front ordering technique, every time a string is used in coding, it is moved to the front of the table before adding new strings at the end of the table. A table maintenance rule used for adding string entries to the string table limits the number of new string entries added for a particular string match to no more than two entries.

Using the example of "abracadabra", the first two letters would result in a table, code stream, and literals stream that are identical to the example D. Adding the third letter "r" would result in different tables, depending on the technique being used to populate the table. After we code the "r", we have a code stream of 0, 0, a literals stream of "abr", and a table that looks like this:

TABLE E1

| Index | 0 | 1 | 2 | 3 | 4 | 5 |
|---|---|---|---|---|---|---|
| String | "" | "a" | "b" | "ab" | "r" | "br" |

At abr[a]cadabra, the coder matches "a", so a 1 code gets added to the code stream, making it 0, 0, 1. Then, the code for "a" gets moved to the front of the table. Finally, "ra" gets appended to the table. The resulting table looks like this:

TABLE E2

| Index | 0 | 1 | 2 | 3 | 4 | 5 | 6 |
|---|---|---|---|---|---|---|---|
| String | "a" | "" | "b" | "ab" | "r" | "br" | "ra" |

At abra[c]adabra, only "" matches, so again a 1 code gets added to the code stream, making it 0, 0, 1, 1. Then, the code for "" gets moved to the front of the table. "c" gets added to the literals stream, making it "abrc". Finally, "c" and "ac" get appended to the table. The resulting table looks like this:

TABLE E3

| Index | 0 | 1 | 2 | 3 | 4 | 5 | 6 | 7 | 8 |
|---|---|---|---|---|---|---|---|---|---|
| String | "" | "a" | "b" | "ab" | "r" | "br" | "ra" | "c" | "ac" |

At abrac[a]dabra, "a" is once again matched, giving a code stream of 0, 0, 1, 1, 1. "a" gets moved to front again, and "ca" gets added to the table:

TABLE E4

| Index | 0 | 1 | 2 | 3 | 4 | 5 | 6 | 7 | 8 | 9 |
|---|---|---|---|---|---|---|---|---|---|---|
| String | "a" | "" | "b" | "ab" | "r" | "br" | "ra" | "c" | "ac" | "ca" |

At abraca[d]abra, only "" matches, so again a 1 code gets added to the code stream, making it 0, 0, 1, 1, 1, 1. The string entry "" gets moved to front. A "d" literal value gets added to the literals stream, making it "abrcd". New string entries for "d" and "ad" get added to the table:

TABLE E5

| Index | 0 | 1 | 2 | 3 | 4 | 5 | 6 | 7 | 8 | 9 | 10 | 11 |
|---|---|---|---|---|---|---|---|---|---|---|---|---|
| String | "" | "a" | "b" | "ab" | "r" | "br" | "ra" | "c" | "ac" | "ca" | "d" | "ad" |

At abracad[a]bra, "ab" matches (3 gets added to the code stream (now 0, 0, 1, 1, 1, 1, 3)), "ab" moves to front, and "dab" gets added to the table:

TABLE E6

| Index | 0 | 1 | 2 | 3 | 4 | 5 | 6 | 7 | 8 | 9 | 10 | 11 | 12 |
|---|---|---|---|---|---|---|---|---|---|---|---|---|---|
| String | "ab" | "" | "a" | "b" | "r" | "br" | "ra" | "c" | "ac" | "ca" | "d" | "ad" | "dab" |

At abracadab[r]a, "ra" matches, so 6 gets added to the code stream (now 0, 0, 1, 1, 1, 1, 3, 6), "ra" moves to front, and "abra" gets added to the table:

TABLE E7

| Index | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| String | "ra" | "ab" | "" | "a" | "b" | "r" | "br" | "c" | "ac" | "ca" | "d" | "ad" | "dab" | "abra" |

Finally, end of stream matches nothing, so the code for "" (2) is added to the code stream, making the final code stream 0, 0, 1, 1, 1, 1, 3, 6, 2.

The following example (example F), described with reference to tables F1-F9, shows another embodiment for compressing data, in which the string table is reordered based on the frequency with which string entries match the input stream. To order the string table based on the most frequently matched string entry (rather than most recently matched string entry), a count of the number of times a code has been used may be maintained. The count may be maintained in the string table or in a separate data structure.

To start with, we have a table with a single entry, capable of coding the string "":

TABLE F1

|  | Index |
|---|---|
|  | 0 |
| String | "" |
| Count | 0 |

At [a]bracadabra, the coder adds "a" to the literals stream, updates the count for the "" code, and adds the string "a" to the table:

TABLE F2

|  | Index | |
|---|---|---|
|  | 0 | 1 |
| String | "" | "a" |
| Count | 1 | 0 |

At a[b]racadabra, the coder emits the code 0, adds "b" to the literals stream (which is now "ab"), updates the count for the "" code, and adds the strings "b" and "ab" to the table:

TABLE F3

|  | Index | | | |
|---|---|---|---|---|
|  | 0 | 1 | 2 | 3 |
| String | "" | "a" | "b" | "ab" |
| Count | 2 | 0 | 0 | 0 |

At ab[r]acadabra, the coder emits the code 0 (so the code stream is now 0, 0) adds "r" to the literals stream (which is now "abr"), updates the count for the "" code, and adds the strings "r", "br" and "abr" to the table:

TABLE F4

|  | Index | | | | | | |
|---|---|---|---|---|---|---|---|
|  | 0 | 1 | 2 | 3 | 4 | 5 | 6 |
| String | "" | "a" | "b" | "ab" | "r" | "br" | "abr" |
| Count | 3 | 0 | 0 | 0 | 0 | 0 | 0 |

At abr[a]cadabra, the coder emits the code 1 (so the code stream is now 0, 0, 1), updates the count for the "a" code, and adds the strings "ra", "bra" and "abra" to the table:

TABLE F5

|  | Index | | | | | | | | | |
|---|---|---|---|---|---|---|---|---|---|---|
|  | 0 | 1 | 2 | 3 | 4 | 5 | 6 | 7 | 8 | 9 |
| String | "" | "a" | "b" | "ab" | "r" | "br" | "abr" | "ra" | "bra" | "abra" |
| Count | 3 | 1 | 0 | 0 | 0 | 0 | 0 | 0 | 0 | 0 |

At abra[c]adabra, the coder emits the code 0 (so the code stream is now 0, 0, 1, 0), adds "c" to the literal stream (which is now "abrc"), updates the count for the "" code, and adds the strings "c", "ac", "rac", "brac" and "abrac" to the table:

TABLE F6

|  | Index | | | | | | | | | | | | | | |
|---|---|---|---|---|---|---|---|---|---|---|---|---|---|---|---|
|  | 0 | 1 | 2 | 3 | 4 | 5 | 6 | 7 | 8 | 9 | 10 | 11 | 12 | 13 | 14 |
| String | "" | "a" | "b" | "ab" | "r" | "br" | "abr" | "ra" | "bar" | "abra" | "c" | "ac" | "rac" | "brac" | "abrac" |
| Count | 4 | 1 | 0 | 0 | 0 | 0 | 0 | 0 | 0 | 0 | 0 | 0 | 0 | 0 | 0 |

At abrac[a]dabra, the coder emits the code 1 (so the code stream is now 0, 0, 1, 0, 1), updates the count for the "a" code, and adds the strings "ca", "aca", "raca", "braca" and "abraca" to the table:

TABLE F7

|  | Index | | | | | | | | | |
|---|---|---|---|---|---|---|---|---|---|---|
|  | 0 | 1 | 2 | 3 | 4 | 5 | 6 | 7 | 8 | 9 |
| String | "" | "a" | "b" | "ab" | "r" | "br" | "abr" | "ra" | "bra" | "abra" |
| Count | 4 | 2 | 0 | 0 | 0 | 0 | 0 | 0 | 0 | 0 |

TABLE F7-continued

| | Index | | | | | | | | | |
|---|---|---|---|---|---|---|---|---|---|---|
| | 10 | 11 | 12 | 13 | 14 | 15 | 16 | 17 | 18 | 19 |
| String | "c" | "ac" | "rac" | "brac" | "abrac" | "ca" | "aca" | "raca" | "braca" | "abraca" |
| Count | 0 | 0 | 0 | 0 | 0 | 0 | 0 | 0 | 0 | 0 |

At abraca[d]abra, the coder emits the code 0 (so the code stream is now 0, 0, 1, 0, 1, 0), adds "d" to the literals stream (which is now "abrcd"), and adds the strings "d", "ad", "cad", "acad", "racad", "bracad" and "abracad" to the table:

TABLE F8

| | Index | | | | | | | | | |
|---|---|---|---|---|---|---|---|---|---|---|
| | 0 | 1 | 2 | 3 | 4 | 5 | 6 | 7 | 8 | 9 |
| String | "" | "a" | "b" | "ab" | "r" | "br" | "abr" | "ra" | "bra" | "abra" |
| Count | 5 | 2 | 0 | 0 | 0 | 0 | 0 | 0 | 0 | 0 |

| | Index | | | | | | | | | |
|---|---|---|---|---|---|---|---|---|---|---|
| | 10 | 11 | 12 | 13 | 14 | 15 | 16 | 17 | 18 | 19 |
| String | "c" | "ac" | "rac" | "brac" | "abrac" | "ca" | "aca" | "raca" | "braca" | "abraca" |
| Count | 0 | 0 | 0 | 0 | 0 | 0 | 0 | 0 | 0 | 0 |

| | Index | | | | | | |
|---|---|---|---|---|---|---|---|
| | 20 | 21 | 22 | 23 | 24 | 25 | 26 |
| String | "d" | "ad" | "cad" | "acad" | "racad" | "bracad" | "abracad" |
| Count | 0 | 0 | 0 | 0 | 0 | 0 | 0 |

At At abracad[a]bra, the coder emits the code 9 (so the code stream is now 0, 0, 1, 0, 1, 0, 9), updates the count for "abra", reorders the table so that the string "abra" comes after "a", and adds the strings "dabra", "adabra", "cadabra", "acadabra", "racadabra", "bracadabra", and "abracadabra" to the table:

TABLE F9

| | Index | | | | | | | | |
|---|---|---|---|---|---|---|---|---|---|
| | 0 | 1 | 2 | 3 | 4 | 5 | 6 | 7 | 8 |
| String | "" | "a" | "abra" | "b" | "ab" | "r" | "br" | "abr" | "ra" |
| Count | 5 | 2 | 1 | 0 | 0 | 0 | 0 | 0 | 0 |

| | Index | | | | | | | | |
|---|---|---|---|---|---|---|---|---|---|
| | 9 | 10 | 11 | 12 | 13 | 14 | 15 | 16 | 17 |
| String | "bra" | "c" | "ac" | "rac" | "brac" | "abrac" | "ca" | "aca" | "raca" |
| Count | 0 | 0 | 0 | 0 | 0 | 0 | 0 | 0 | 0 |

| | Index | | | | | | | | |
|---|---|---|---|---|---|---|---|---|---|
| | 18 | 19 | 20 | 21 | 22 | 23 | 24 | 25 | 26 |
| String | "braca" | "abraca" | "d" | "ad" | "cad" | "acad" | "racad" | "bracad" | "abracad" |
| Count | 0 | 0 | 0 | 0 | 0 | 0 | 0 | 0 | 0 |

| | Index | | | | | | |
|---|---|---|---|---|---|---|---|
| | 27 | 28 | 29 | 30 | 31 | 32 | 33 |
| String | "dabra" | "adabra" | "cadabra" | "acadabra" | "racadabra" | "bracadabra" | "abracadabra" |
| Count | 0 | 0 | 0 | 0 | 0 | 0 | 0 |

At the end of the stream, the coder emits the code 0, making the final code stream 0, 0, 1, 0, 1, 9, 0.

Another variant would put generated strings at the front of the table (but after strings that have been used).

In the following example (example G), described with reference to tables G1-G9, the size of the string table is set to a maximum of 8 string entries. Example G uses the following table management rules: modified LZ78 string generation rules, reordering by move-to-front, and inserting new strings at the head of the table. Other insertion orders are also possible. For example, a coder that keeps track of which strings have been used to generate codes could put the new string insertion point past all of these strings (or after half of them, if they take up more than half the table).

In example G, after coding the "a" of [a]bracadabra to get a literals stream of "a", at a[b]racadabra, the coder emits the code 0, adds "b" to the literals stream, and adds the strings "b" and "ab" to the table (in front of the "a"):

TABLE G1

|  | Index | | | |
| --- | --- | --- | --- | --- |
|  | 0 | 1 | 2 | 3 |
| String | "" | "b" | "ab" | "a" |

At ab[r]acadabra, the coder emits the code 0 (making the code stream 0, 0), adds "r" to the literals stream (making the literals stream "abr"), and adds the strings "r" and "br" to the table (in front of the "b"):

TABLE G2

|  | Index | | | | | |
| --- | --- | --- | --- | --- | --- | --- |
|  | 0 | 1 | 2 | 3 | 4 | 5 |
| String | "" | "r" | "br" | "b" | "ab" | "a" |

At abr[a]cadabra, the coder emits the code for "a" (which is 5, so the code stream becomes 0, 0, 5), moves the "a" code to the front of the table, and adds the string "ra" to the table in front of "":

TABLE G3

|  | Index | | | | | | |
| --- | --- | --- | --- | --- | --- | --- | --- |
|  | 0 | 1 | 2 | 3 | 4 | 5 | 6 |
| String | "a" | "ra" | "" | "r" | "br" | "b" | "ab" |

At abra[c]adabra, the coder emits the code for "", which is now 2 (making the code stream 0, 0, 5, 2), adds "c" to the literals stream (which is now "abrc"), and moves "" to the front of the table. The coder can successfully insert the string "c" into the table, but attempting to insert "ac" into the table causes overflow—to avoid the overflow, the last four entries are dropped, and then the "ac" entry is added to the table. This results in the following table:

TABLE G4

|  | Index | | | | |
| --- | --- | --- | --- | --- | --- |
|  | 0 | 1 | 2 | 3 | 4 |
| String | "" | "c" | "ac" | "a" | "ra" |

At abrac[a]dabra, the coder emits the code for "a", which is now 3 (so the code stream is 0, 0, 5, 2, 3). "a" moves to the front, and "ca" gets added to the table before "":

TABLE G5

|  | Index | | | | | |
| --- | --- | --- | --- | --- | --- | --- |
|  | 0 | 1 | 2 | 3 | 4 | 5 |
| String | "a" | "ca" | "" | "c" | "ac" | "ra" |

At abraca[d]abra, the coder emits the code for "", which is now 2 (so the code stream is 0, 0, 5, 2, 3, 2), and adds "d" to the literals stream (which is now "abrcd"). The "" entry is moved to the front, and the strings "d" and "ad" are added to the table in front of "a":

TABLE G6

|  | Index | | | | | | | |
| --- | --- | --- | --- | --- | --- | --- | --- | --- |
|  | 0 | 1 | 2 | 3 | 4 | 5 | 6 | 7 |
| String | "" | "d" | "ad" | "a" | "ca" | "c" | "ac" | "ra" |

At this point, the table contains 8 entries. Adding a string to the table would cause it to overflow, so the last half can be discarded at this point. However, since it's possible that the last half contains a string that could be used for the next code, it's a better idea to only prune the table when it's about to overflow.

At abracad[a]bra, the coder emits the code for "a", which is now 3 (so the code stream is 0, 0, 5, 2, 3, 2, 3). The table is reordered to move the "a" to the front. Attempting to add the string "da" to the table would trigger overflow, so after the table is reordered, the last four entries are discarded, then "da" is added to the table before "":

TABLE G7

|  | Index | | | | |
| --- | --- | --- | --- | --- | --- |
|  | 0 | 1 | 2 | 3 | 4 |
| String | "a" | "da" | "" | "d" | "ad" |

At abracada[b]ra, there is no longer a match, since we discarded the string entries starting with "b". The only choice is to emit the "" code (2, making the code stream 0, 0, 5, 2, 3, 2, 3, 2) and add the "b" to the literals stream again (which would become "abrcdb"). Moving "" to the front and adding "b" and "ab":

TABLE G8

|  | Index | | | | | | |
| --- | --- | --- | --- | --- | --- | --- | --- |
|  | 0 | 1 | 2 | 3 | 4 | 5 | 6 |
| String | "" | "b" | "ab" | "a" | "da" | "d" | "ad" |

At abracadab[r]a, the coder again has to use "", since the strings containing "r" have all been discarded. This makes the code stream 0, 0, 5, 2, 3, 2, 3, 2, 0, and the literals stream "abrcdbr". Adding "r" and "br" to the table will cause an overflow. Discarding the last four entries after adding "r", and then adding "br", results in the following table:

TABLE G9

| | Index | | | | |
|---|---|---|---|---|---|
| | 0 | 1 | 2 | 3 | 4 |
| String | "" | "r" | "br" | "b" | "ab" |

Figure 4C:
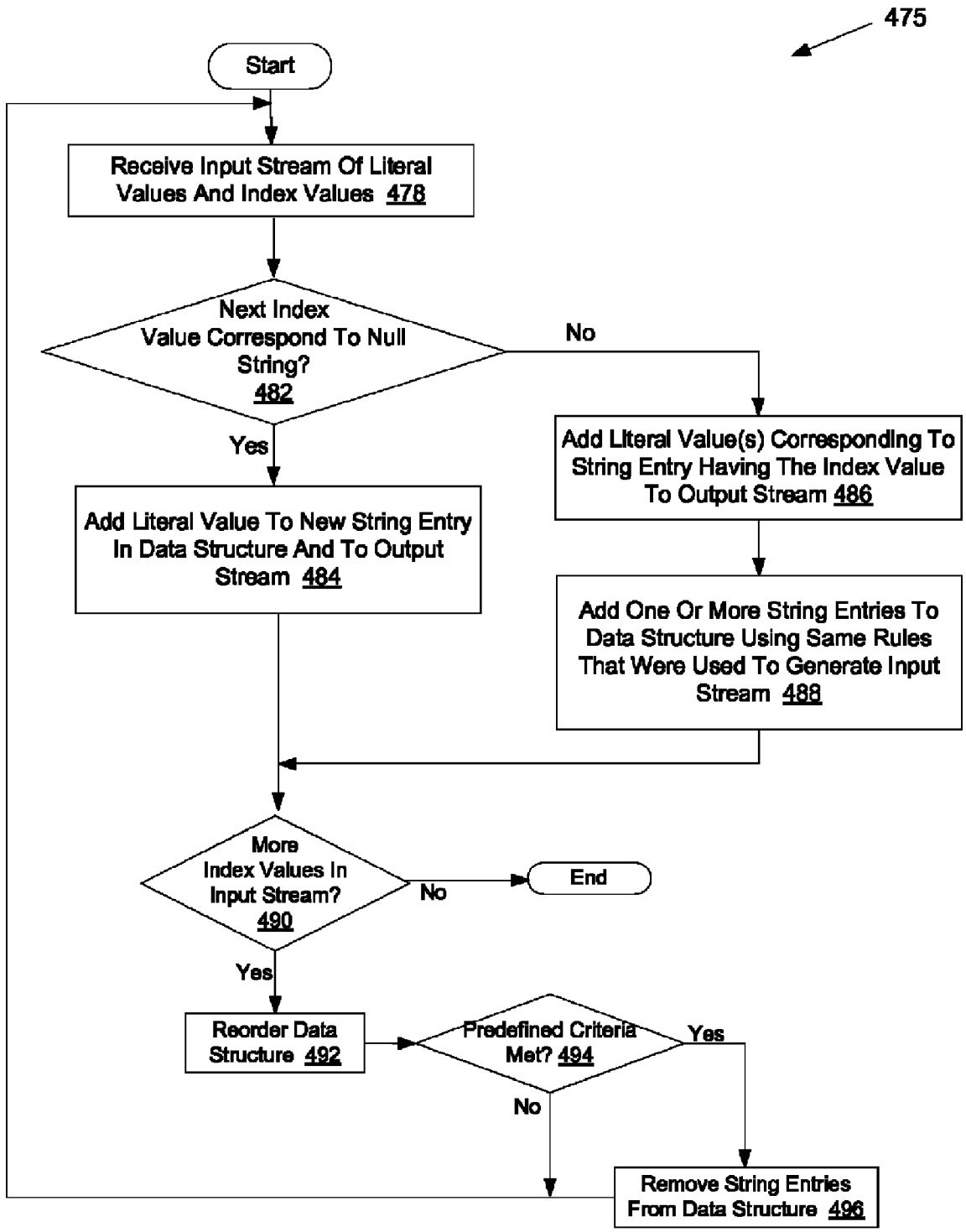
FIG. 4C illustrates a flow diagram of another embodiment for a method of decompressing data.

At abracadabra[a], the coder is again forced to use "" as the code, since "a" was just discarded. The code stream becomes 0, 0, 5, 2, 3, 2, 3, 2, 0, 0, and the literals stream becomes "abrcdbra". A final code of 0, without a corresponding literal, will give the final code stream of 0, 0, 5, 2, 3, 2, 3, 2, 0, 0, 0, and the final literals stream of "abrcdbra FIG. 4C illustrates a flow diagram of another embodiment for a method 475 of decompressing data. Method 475 can be performed to decompress data that has been compressed using method 400 and/or method 410. Method 475 may be performed by processing logic that may comprise hardware (e.g., circuitry, dedicated logic, programmable logic, microcode, etc.), software (such as instructions run on a processing device), or a combination thereof. In one embodiment, method 475 is performed by compressor/decompressor 215 of FIG. 2.

Referring to FIG. 4C, at block 478 an input stream that includes literal values and index values is received by a decompressor. Upon receiving the input stream, the decompressor may initialize a data structure. The initialized data structure corresponds to a data structure that was previously initialized when the data was compressed. For example, if a data structure including only the null string was initialized when the data was compressed, then a data structure including only the null string is also initialized before decompressing the data.

At block 482, the decompressor determines whether a next index value (or first index value if there have been no previous index values) corresponds to the null string. If the next index value corresponds to the null string the method proceeds to block 484. If the next index value does not correspond to the null string, the method proceeds to b lock 486.

At block 384, a new string entry is added to the data structure for the literal value. The literal value is also added to the output stream. The method then proceeds to block 490.

At block 486, the decompressor adds literal values corresponding to a string entry associated with the index value to the output stream. For example, if the index value was 4, and it corresponded to the string entry "ABCD", then the literal values for A, B, C and D would be added to the output stream. The method continues to block 488.

At block 488, one or more string entries are added to the data structure using the same data structure maintenance rules that were used to compress the data (e.g., to generate the input stream). For example, if the rules of adding string entries of method 410 were used to compress the data (as identified, for example, in blocks 465 and 470), then those same rules may be used to add string entries to the data structure during decompression. It is important that the same rules for managing the data structure be used for both compression and decompression to ensure that decompressed data exactly matches the data as it existed before it was compressed.

At block 490, the decompressor determines whether there are any more index values in the second input stream. If there are additional index values, then the method continues to block 492. Otherwise, the data has been completely decompressed, and the method ends.

At block 492, the decompressor reorders the data structure. The data structure should be reordered using the same reordering rules that were used to reorder a data structure that was maintained for compressing the data (and for generating the current input stream). In one embodiment, string entries are reordered in the data structure such that those string entries that frequently match strings from portions of the input stream are assigned low index values and string entries that infrequently match strings from portions of the input stream are assigned high index values. In one embodiment, a count is maintained of the number of times that each string entry matches a string in the data stream. Those string entries with higher counts may be assigned low index values, while those string entries with lower counts may be assigned high index values. In another embodiment, a move-to-front reordering rule is used in which each time a match is made to a string entry, that string entry is moved to the top of the data structure (e.g., such that the string entry has an index value of zero), and all other string entries are shifted down one place (e.g., a string entry that previously had an index value of 1 would subsequently have an index value of 2). Other reordering schemes may also be used.

At block 494, the compressor determines whether a predefined criterion or criteria for deleting string entries from the data structure has been met. As with the reordering rules, rules for deleting string entries from the data structure should correspond to rules that were used for deleting string entries from a data structure that was maintained during data compression. Examples of predefined criteria include a size threshold for the data structure, a time interval, etc. If the predefined criteria are met, the method proceeds to block 496, and one or more string entries are removed from the data structure. If no predefined criteria are met, the method returns to block 478.

Another example of decompressing data (example H) in accordance with an embodiment of the present invention is shown below with reference to tables H1-H7. Example H decompresses data that was compressed in example E using the same table maintenance rules that were used in example E. Decoding the code stream 0, 0, 1, 1, 1, 1, 3, 6, 2 with the literal stream abrcd, using move-to-front, would proceed as follows:

First, the first literal is consumed, added to the table, and added to the output. The output is now "a", the unconsumed literals stream is brcd, and the table is:

TABLE H1

| | Index | |
|---|---|---|
| | 0 | 1 |
| String | "" | "a" |

The decoder now consumes the first code in the code stream, corresponding to "". This directs the decoder to consume the next literal (leaving rcd unconsumed), add it to the end of the output (which is now "ab"), and add two strings ("b" and "ab") to the table:

TABLE H2

| | Index | | | |
|---|---|---|---|---|
| | 0 | 1 | 2 | 3 |
| String | "" | "a" | "b" | "ab" |

The decoder consumes the second code (0), corresponding to "". Again, a literal gets consumed and added to the output (making the unconsumed literals stream cd, and the output "abr"), and two strings ("r" and "br") get added to the table:

TABLE H3

| String | Index | | | | | |
|---|---|---|---|---|---|---|
| | 0 | 1 | 2 | 3 | 4 | 5 |
| | "" | "a" | "b" | "ab" | "r" | "br" |

The decoder now comes to its first non-zero code, which directs it to add "a" to the end of the output, reorder the table so the used string is now first, and add "ra" to the end of the table:

TABLE H4

| String | Index | | | | | | |
|---|---|---|---|---|---|---|---|
| | 0 | 1 | 2 | 3 | 4 | 5 | 6 |
| | "a" | "" | "b" | "ab" | "r" | "br" | "ra" |

The unconsumed code stream is 1, 1, 1, 3, 6, 2, the output is "abra", and the unconsumed literals stream is "cd". Consuming the next code, the decoder gets the "" string, so it consumes a literal, adds it to the output, moves the "" to the front of the table, and adds the strings "c" and "ac" to the table. The unconsumed code stream is 1, 1, 3, 6, 2, the output is "abrac", the unconsumed literals stream is d, and the table now contains:

TABLE H5

| String | Index | | | | | | | | |
|---|---|---|---|---|---|---|---|---|---|
| | 0 | 1 | 2 | 3 | 4 | 5 | 6 | 7 | 8 |
| | "" | "a" | "b" | "ab" | "r" | "br" | "ra" | "c" | "ac" |

The next two codes will add "ad" to the end of the output stream (making it "abracad"), consume the remaining literal, and add the strings "ca", "d", and "ad" to the end of the table:

TABLE H6

| String | Index | | | | | | | | | | | |
|---|---|---|---|---|---|---|---|---|---|---|---|---|
| | 0 | 1 | 2 | 3 | 4 | 5 | 6 | 7 | 8 | 9 | 10 | 11 |
| | "" | "a" | "b" | "ab" | "r" | "br" | "ra" | "c" | "ac" | "ca" | "d" | "ad" |

The next code in the code stream (3) will add "ab" to the end of the output (making it "abracadab"), move "ab" to the front of the table, and add "dab" to the end of the table. The code 6 will add "ra" to the output, move "ra" to the front of the table, and add "abra" to the end of the table. The output is now "abracadabra", and the table is:

TABLE H7

| String | Index | | | | | | | | | | | | | |
|---|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| | "ra" | "ab" | "" | "a" | "b" | "r" | "br" | "c" | "ac" | "ca" | "d" | "ad" | "dab" | "abra" |

The code for 2 matches the ""; since there are no more literals, the process terminates. The decompressed data is abracadabra, which matches the input stream that was compressed in example E above.

Figure 5:
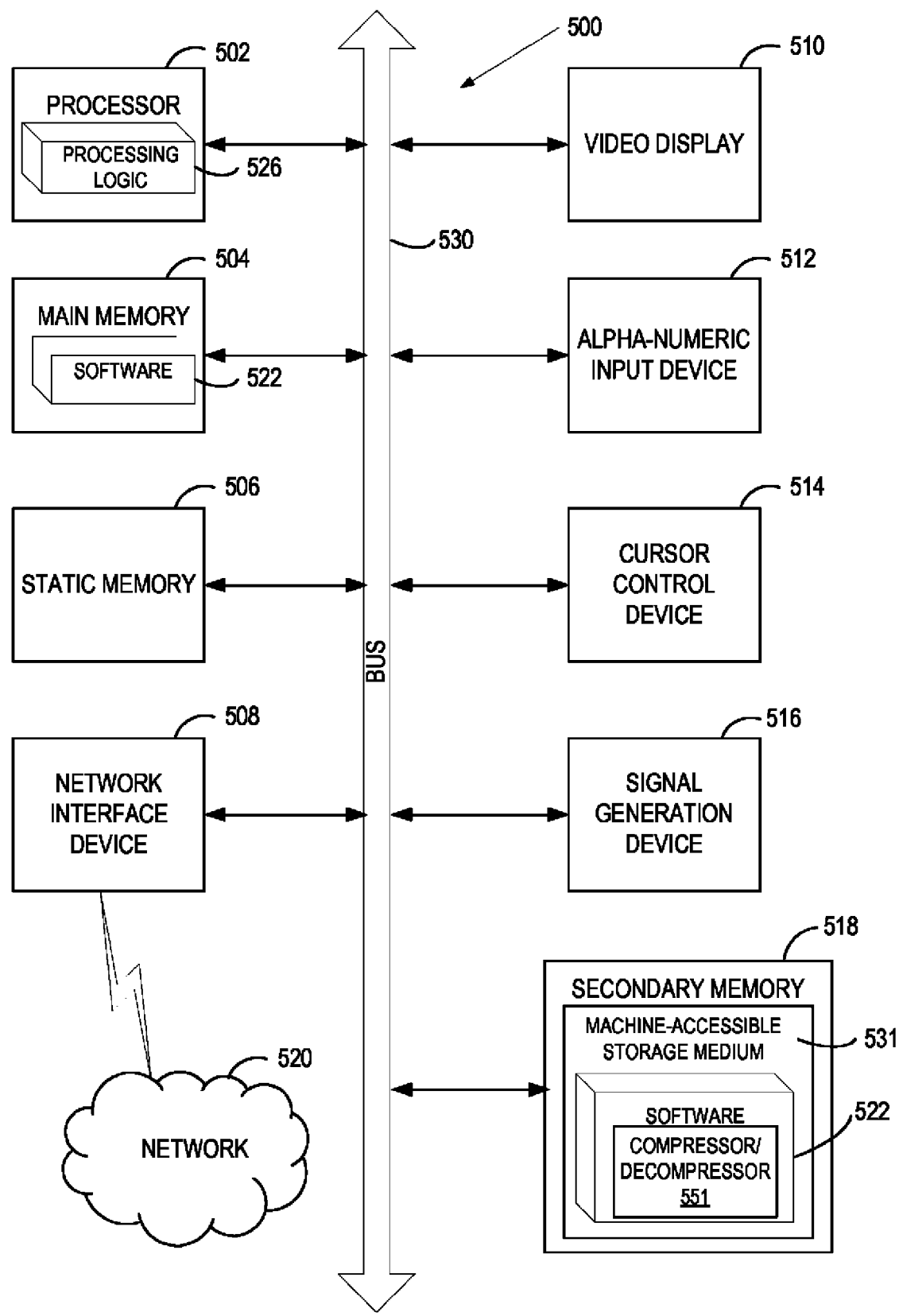
FIG. 5 illustrates a diagrammatic representation of a machine in the exemplary form of a computer system, in accordance with one embodiment of the present invention.

FIG. 5 illustrates a diagrammatic representation of a machine in the exemplary form of a computer system 500 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations and steps discussed herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-readable storage medium (or more specifically a computer-readable storage medium) 531 on which is stored one or more sets of instructions (e.g., software 522) embodying any one or more of the methodologies or functions described herein. The software 522 may also reside, completely or at least partially, within the main memory 504 and/or within the processing device 502 during execution thereof by the computer system 500, the main memory 504 and the processing device 502 also constituting machine-readable storage media. The software 522 may further be transmitted or received over a network 520 via the network interface device 508.

The machine-readable storage medium 531 may also be used to store a compressor/decompressor 551, and/or a software library containing methods that call the compressor/decompressor 551. In one embodiment, the compressor/decompressor 551 corresponds to compressor/decompressor 215 of FIG. 2. While the machine-readable storage medium 531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A computer implemented method of compressing data, comprising:
   receiving an input stream of characters;
   adding a new string entry to a data structure based on a current portion of the input stream if the current portion fails to match any of a plurality of existing string entries in the data structure;
   adding an additional string entry to the data structure based on a combination of the current portion and a previous portion of the input stream, wherein the additional string entry corresponds to a subset of the combination that fails to match any of the plurality of existing string entries in the data structure; and
   transforming the input stream into an output stream that includes literal values of the characters and index values corresponding to string entries in the data structure that match portions of the input stream.

2. The method of claim 1, wherein the additional string entry has a length that is less than or equal to a maximum string length.

3. The method of claim 1, wherein a number of bits that are used to represent the index values is based on a size of the data structure, and wherein the size of the data structure is variable.

4. The method of claim 1, further comprising:
   reordering the data structure to cause string entries that frequently match portions of the input stream to have lower index values than string entries that infrequently match portions of the input stream.

5. The method of claim 4, wherein the reordering reduces a range of index values that are included in the output stream, the method further comprising:
   processing the index values included in the output stream using an entropy encoder.

6. The method of claim 4, further comprising:
   reducing a size of the data structure by removing string entries based on a predefined criteria.

7. The method of claim 1, further comprising:
   adding a plurality of additional string entries to the data structure based on the combination of the current portion and the previous portion, wherein each of the plurality of additional string entries corresponds to a different subset of the combination that fails to match any of the plurality of existing string entries.

8. A computer readable medium including instructions that, when executed by a processing system, cause the processing system to perform a method comprising:
   receiving an input stream of characters;
   adding a new string entry to a data structure based on a current portion of the input stream if the current portion fails to match any of a plurality of existing string entries in the data structure;
   adding an additional string entry to the data structure based on a combination of the current portion and a previous portion of the input stream, wherein the additional string entry corresponds to a subset of the combination that fails to match any of the plurality of existing string entries in the data structure; and
   transforming the input stream into an output stream that includes literal values of the characters and index values corresponding to string entries in the data structure that match portions of the input stream.

9. The computer readable medium of claim 8, wherein the additional string entry has a length that is less than or equal to a maximum string length.

10. The computer readable medium of claim 8, wherein a number of bits that are used to represent the index values is based on a size of the data structure, and wherein the size of the data structure is variable.

11. The computer readable medium of claim 8, the method further comprising:
    reordering the data structure to cause string entries that frequently match portions of the input stream to have lower index values than string entries that infrequently match portions of the input stream.

12. The computer readable medium of claim 11, wherein the reordering reduces a range of index values that are included in the output stream, the method further comprising:
    processing the index values included in the output stream using an entropy encoder.

13. The computer readable medium of claim 11, the method further comprising:
reducing a size of the data structure by removing string entries based on a predefined criteria.

14. The computer readable medium of claim 8, the method further comprising:
adding a plurality of additional string entries to the data structure based on the combination of the current portion and the previous portion, wherein each of the plurality of additional string entries corresponds to a different subset of the combination that fails to match any of the plurality of existing string entries.

15. A computing apparatus, comprising:
a memory including instructions for a data compressor; and
a processor, connected with the memory, to execute the instructions, wherein the instructions cause the processor to:
receive an input stream of characters;
add a new string entry to a data structure based on a current portion of the input stream if the current portion fails to match any of a plurality of existing string entries in the data structure;
add an additional string entry to the data structure based on a combination of the current portion and a previous portion of the input stream, wherein the additional string entry corresponds to a subset of the combination that fails to match any of the plurality of existing string entries in the data structure; and
transform the input stream into an output stream that includes literal values of the characters and index values corresponding to string entries in the data structure that match portions of the input stream.

16. The computing apparatus of claim 15, wherein the additional string entry has a length that is less than or equal to a maximum string length.

17. The computing apparatus of claim 15, wherein a number of bits that are used to represent the index values is based on a size of the data structure, and wherein the size of the data structure is variable.

18. The computing apparatus of claim 15, the processor further to reorder the data structure to cause string entries that frequently match portions of the input stream to have lower index values than string entries that infrequently match portions of the input stream.

19. The computing apparatus of claim 18, wherein the reordering reduces a range of index values that are included in the output stream, the processor further to process the index values included in the output stream using an entropy encoder.

20. The computing apparatus of claim 18, the processor further to reduce a size of the data structure by removing string entries based on a predefined criteria.

21. The computing apparatus of claim 15, the processor further to add a plurality of additional string entries to the data structure based on the combination of the current portion and the previous portion, wherein each of the plurality of additional string entries corresponds to a different subset of the combination that fails to match any of the plurality of existing string entries.

* * * * *